United States Patent
Someya et al.

(10) Patent No.: US 9,261,790 B2
(45) Date of Patent: Feb. 16, 2016

(54) RESIST UNDERLAYER FILM-FORMING COMPOSITION CONTAINING COPOLYMER RESIN HAVING HETEROCYCLIC RING

(71) Applicant: NISSAN CHEMICAL INDUSTRIES, LTD., Tokyo (JP)

(72) Inventors: Yasunobu Someya, Toyama (JP); Keisuke Hashimoto, Toyama (JP); Tetsuya Shinjo, Toyama (JP); Hirokazu Nishimaki, Toyama (JP); Ryo Karasawa, Toyama (JP); Rikimaru Sakamoto, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/370,256

(22) PCT Filed: Jan. 25, 2013

(86) PCT No.: PCT/JP2013/051598
§ 371 (c)(1),
(2) Date: Jul. 2, 2014

(87) PCT Pub. No.: WO2013/115097
PCT Pub. Date: Aug. 8, 2013

(65) Prior Publication Data
US 2015/0011092 A1 Jan. 8, 2015

(30) Foreign Application Priority Data
Feb. 1, 2012 (JP) ................................ 2012-020123

(51) Int. Cl.
| | |
|---|---|
| G03F 7/11 | (2006.01) |
| C08G 73/06 | (2006.01) |
| C08G 12/26 | (2006.01) |
| G03F 7/09 | (2006.01) |
| H01L 21/308 | (2006.01) |
| C08G 16/02 | (2006.01) |
| C09D 161/26 | (2006.01) |
| C09D 179/04 | (2006.01) |

(52) U.S. Cl.
CPC ........ *G03F 7/11* (2013.01); *C08G 12/26* (2013.01); *C08G 16/0275* (2013.01); *C08G 73/06* (2013.01); *C08G 73/0627* (2013.01); *C09D 161/26* (2013.01); *C09D 179/04* (2013.01); *G03F 7/094* (2013.01); *H01L 21/3088* (2013.01)

(58) Field of Classification Search
CPC ... G08G 73/06; G08G 73/0627; G08G 12/26; G08G 16/0275; G03F 7/11; G03F 7/094
See application file for complete search history.

(56) References Cited

U.S. PATENT DOCUMENTS

| | | | | |
|---|---|---|---|---|
| 5,298,578 | A | * | 3/1994 | DeWald et al. .................. 526/74 |
| 7,378,217 | B2 | | 5/2008 | Oh et al. |
| 7,619,055 | B2 | * | 11/2009 | Li et al. .......................... 528/373 |
| 2006/0019195 | A1 | | 1/2006 | Hatakeyama et al. |
| 2009/0306370 | A1 | * | 12/2009 | Wakita ............................. 544/35 |
| 2012/0077345 | A1 | | 3/2012 | Saito et al. |
| 2012/0252218 | A1 | | 10/2012 | Kori et al. |

FOREIGN PATENT DOCUMENTS

| | | |
|---|---|---|
| JP | A-1-154050 | 6/1989 |
| JP | A-1-304149 | 12/1989 |
| JP | A-2-22657 | 1/1990 |
| JP | A-2-293850 | 12/1990 |
| JP | A-10-152636 | 6/1998 |
| JP | A-2005-128509 | 5/2005 |
| JP | A-2007-178974 | 7/2007 |
| JP | A-2007-199653 | 8/2007 |
| JP | A-2007-297540 | 11/2007 |
| JP | A-2012-214720 | 11/2012 |
| WO | WO 2010/147155 A1 | 12/2010 |

OTHER PUBLICATIONS

International Search Report issued in International Patent Application No. PCT/JP2013/051598 mailed on Apr. 9, 2013.
Written Opinion of the International Searching Authority issued in International Patent Application No. PCT/JP2013/051598 mailed on Apr. 9, 2013.

* cited by examiner

*Primary Examiner* — Vickey Nerangis
(74) *Attorney, Agent, or Firm* — Oliff PLC

(57) ABSTRACT

A resist underlayer film-forming composition for forming a resist underlayer film having both dry etching resistance and heat resistance. A resist underlayer film-forming composition comprising a polymer containing a unit structure of Formula (1):

Formula (1)

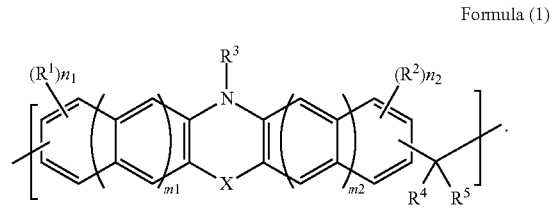

In Formula (1), $R^3$ is a hydrogen atom, and both n1 and n2 are 0. A method for producing a semiconductor device comprising the steps of: forming an underlayer film on a semiconductor substrate using the resist underlayer film-forming composition; forming a hard mask on the underlayer film; further forming a resist film on the hard mask; forming a resist pattern by irradiation with light or electron beams and development; etching the hard mask using the resist pattern; etching the underlayer film using the hard mask patterned; and fabricating the semiconductor substrate using the patterned underlayer film.

15 Claims, No Drawings

RESIST UNDERLAYER FILM-FORMING COMPOSITION CONTAINING COPOLYMER RESIN HAVING HETEROCYCLIC RING

TECHNICAL FIELD

The present invention relates to a resist underlayer film-forming composition for lithography that is useful in fabricating a semiconductor substrate, a resist pattern forming method using the resist underlayer film-forming composition, and a method for producing a semiconductor device.

BACKGROUND ART

Conventionally, microfabrication by lithography using photoresist compositions has been performed in the production of semiconductor devices. This microfabrication is a fabrication method that includes forming a thin film of a photoresist composition on a substrate to be fabricated such as a silicon wafer, radiating active rays such as ultraviolet rays onto the thin film through a mask pattern in which a pattern of a semiconductor device is formed, developing the film, and etching the substrate to be fabricated such as a silicon wafer using the obtained photoresist pattern as a protective film. In recent years, higher integration of semiconductor devices has been pursued, and there is a trend for the active rays used to have shorter wavelengths from KrF excimer lasers (248 nm) to ArF excimer lasers (193 nm). This trend has been accompanied by significant issues of effects due to standing waves and diffuse reflection of the active rays from the substrate. Accordingly, methods have been extensively studied that include providing an anti-reflective coating (Bottom Anti-Reflective Coating, BARC) between the photoresist and the substrate to be fabricated.

When a finer resist pattern is further pursued, an issue of resolution and an issue in which the resist pattern collapses after development may occur, and thus thinner resists are required. This makes it difficult to achieve sufficient resist pattern film thickness for fabrication of a substrate, and thus a process has become necessary in which the function of a mask during the substrate fabrication is imparted not only to the resist pattern, but also to a resist underlayer film that is formed between the resist and a semiconductor substrate to be fabricated. As a resist underlayer film for such a process, unlike a conventional resist underlayer film having a high etching-rate property (high etching rate), a resist underlayer film for lithography having a selection ratio of dry etching rate that is close to that of the resist, a resist underlayer film for lithography having a selection ratio of dry etching rate that is smaller than that of the resist, or a resist underlayer film for lithography having a selection ratio of dry etching rate that is smaller than that of the semiconductor substrate is required.

Examples of a polymer for the resist underlayer film described above include the followings.

Resist underlayer film-forming compositions each including polyvinyl carbazole are exemplified (see Patent Document 1, Patent Document 2, and Patent Document 3).

A resist underlayer film-forming composition including a fluorene phenol novolak resin is disclosed (see Patent Document 4, for example).

A resist underlayer film-forming composition including a fluorene naphthol novolak resin is disclosed (see Patent Document 5, for example).

Resist underlayer film-forming compositions each containing fluorene phenol and aryl alkylene as repeating units are disclosed (see Patent Document 6 and Patent Document 7, for example).

A resist underlayer film-forming composition including carbazole novolak is disclosed (see Patent Document 8, for example).

PRIOR ART DOCUMENTS

Patent Documents

Patent Document 1: Japanese Patent Application Publication No. 2-293850.
Patent Document 2: Japanese Patent Application Publication No. 1-154050
Patent Document 3: Japanese Patent Application Publication No. 2-22657
Patent Document 4: Japanese Patent Application Publication No. 2005-128509
Patent Document 5: Japanese Patent Application Publication No. 2007-199653
Patent Document 6: Japanese Patent Application Publication No. 2007-178974
Patent Document 7: U.S. Pat. No. 7,378,217
Patent Document 8: WO2010-147155

SUMMARY OF THE INVENTION

Problem to be Solved by the Invention

The present invention provides a resist underlayer film-forming composition used in a lithography process of semiconductor device production. The present invention also provides a resist underlayer film for lithography having a selection ratio of dry etching rate that is close to that of a resist, a resist underlayer film for lithography having a selection ratio of dry etching rate that is smaller than that of the resist, or a resist underlayer film for lithography having a selection ratio of dry etching rate that is smaller than that of a semiconductor substrate, with each of which an excellent resist pattern can be obtained without occurrence of intermixing with a resist layer. The present invention can also impart a property of efficiently absorbing light reflected from a substrate when irradiation light having a wavelength of 248 nm, 193 nm, or 157 nm, for example, is used in microfabrication. Further, the present invention provides a method for forming a resist pattern using the resist underlayer film-forming composition. In addition, the present invention provides a resist underlayer film-forming composition for forming a resist underlayer film that also has heat resistance.

Means for Solving the Problem

The invention of the present application provides, as a first aspect, a resist underlayer film-forming composition comprising: a polymer containing a unit structure of Formula (1):

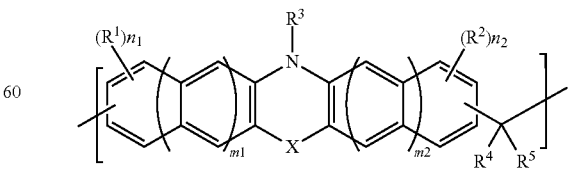

Formula (1)

(in Formula (1), $R^1$ and $R^2$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$R^3$ is a hydrogen atom, or a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$R^4$ is a $C_{6-40}$ aryl group or a heterocyclic group, and the aryl group and the heterocyclic group each are optionally substituted with a halogen group, a nitro group, an amino group, a $C_{1-10}$ alkyl group, a $C_{1-10}$ alkoxy group, a $C_{6-40}$ aryl group, a formyl group, a carboxy group, a carboxylic acid ester group, or a hydroxy group;

$R^5$ is a hydrogen atom, a $C_{1-10}$ alkyl group, a $C_{6-40}$ aryl group, or a heterocyclic group, and the alkyl group, the aryl group, and the heterocyclic group each are optionally substituted with a halogen group, a nitro group, an amino group, or a hydroxy group, and $R^4$ and $R^5$ optionally form a ring together with a carbon atom bonded to $R^4$ and $R^5$;

X is an O atom, a S atom, a $CH_2$ group, a C=O group, a CH=CH group, or a $CH_2$—$CH_2$ group; n1 and n2 each are an integer of 0 to 3; and m1 and m2 each are an integer of 0 to 3);

as a second aspect, a resist underlayer film-forming composition comprising: a polymer containing a unit structure of Formula (2):

Formula (2)

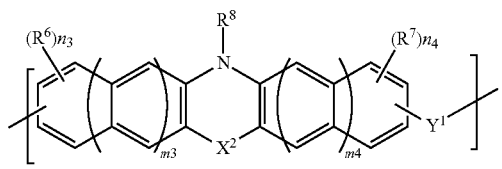

(in Formula (2), $R^6$ and $R^7$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$R^8$ is a hydrogen atom, or a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$X^2$ is an O atom, a S atom, a $CH_2$ group, a C=O group, a CH=CH group, or a $CH_2$—$CH_2$ group;

$Y^1$ is a divalent group derived from a cycloolefin ring compound;

n3 and n4 each are an integer of 0 to 3; and m3 and m4 each are an integer of 0 to 3);

as a third aspect, the resist underlayer film-forming composition according to the first aspect, in which $R^3$ is a hydrogen atom in Formula (1);

as a fourth aspect, the resist underlayer film-forming composition according to the second aspect, in which $R^8$ is a hydrogen atom in Formula (2);

as a fifth aspect, the resist underlayer film-forming composition according to the first aspect or the third aspect, in which both n1 and n2 are 0 in Formula (1);

as a sixth aspect, the resist underlayer film-forming composition according to the second aspect or the fourth aspect, in which both n3 and n4 are 0 in Formula (2);

as a seventh aspect, the resist underlayer film-forming composition according to the first aspect, the third aspect, or the fifth aspect, in which the polymer is a polymer containing the unit structure of Formula (1) as described in claim 1 and a unit structure of Formula (3):

Formula (3)

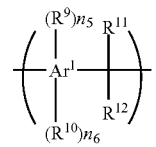

(in Formula (3), $Ar^1$ is a $C_{6-20}$ aromatic ring group; $R^9$ and $R^{10}$ each are a substituent of a hydrogen atom on an aromatic ring, $R^9$ is a hydroxy group, and $R^{10}$ is a halogen group, a nitro group, an amino group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or an organic group in which any of these are combined; $R^{11}$ is a hydrogen atom, or a $C_{6-40}$ aryl group or a heterocyclic group that is optionally substituted with a halogen group, a nitro group, an amino group, a formyl group, a carboxy group, or a hydroxy group; $R^{12}$ is a hydrogen atom, or a $C_{1-10}$ alkyl group, a $C_{6-40}$ aryl group, or a heterocyclic group that is optionally substituted with a halogen group, a nitro group, an amino group, a formyl group, a carboxy group, or a hydroxy group, and $R^{11}$ and $R^{12}$ optionally form a ring together with a carbon atom bonded to $R^{11}$ and $R^{12}$; n5 is an integer [from one to (maximum number of substituents that are capable of being substituted on an $Ar^1$ ring)]; and n6 is an integer [from ((maximum number of substituents that are capable of being substituted on the $Ar^1$ ring)−n5) to zero]);

as an eighth aspect, the resist underlayer film-forming composition according to the second aspect, the fourth aspect, or the sixth aspect, in which the polymer is a polymer containing the unit structure of Formula (2) as described in the second aspect and a unit structure of Formula (4):

Formula (4)

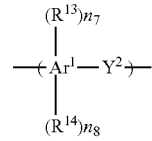

(in Formula (4), $Ar^2$ is a $C_{6-20}$ aromatic ring group; $R^{13}$ and $R^{14}$ each are a substituent of a hydrogen atom on an aromatic ring, $R^{13}$ is a hydroxy group, and $R^{14}$ is a halogen group, a nitro group, an amino group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or an organic group in which any of these are combined; $Y^2$ is a divalent group derived from a cycloolefin ring compound;

n7 is an integer [from one to (maximum number of substituents that are capable of being substituted on an $Ar^2$ ring)]; and n8 is an integer [from ((maximum number of substituents that are capable of being substituted on the $Ar^2$ ring)−n7) to zero]);

as a ninth aspect, the resist underlayer film-forming composition according to any one of the first aspect to the eighth aspect, further comprising: a cross-linking agent;

as a tenth aspect, the resist underlayer film-forming composition according to any one of the first aspect to the ninth aspect, further comprising: an acid and/or an acid generator;

as an eleventh aspect, a resist underlayer film obtained by applying the resist underlayer film-forming composition as described in any one of the first aspect to the tenth aspect onto a semiconductor substrate and baking the resist underlayer film-forming composition;

as a twelfth aspect, a method for forming a resist pattern used in production of a semiconductor, the method comprising the steps of: applying the resist underlayer film-forming composition as described in any one of the first aspect to the tenth aspect onto a semiconductor substrate and baking the resist underlayer film-forming composition to form an underlayer film;

as a thirteenth aspect, a method for producing a semiconductor device, the method comprising the steps of: forming an underlayer film on a semiconductor substrate using the resist underlayer film-forming composition as described in any one of the first aspect to the tenth aspect; forming a resist film on the underlayer film; forming a resist pattern by irradiation with light or electron beams and development; etching the underlayer film using the resist pattern; and fabricating the semiconductor substrate using the patterned underlayer film;

as a fourteenth aspect, a method for producing a semiconductor device, the method comprising the steps of: forming an underlayer film on a semiconductor substrate using the resist underlayer film-forming composition as described in any one of the first aspect to the tenth aspect; forming a hard mask on the underlayer film; further forming a resist film on the hard mask; forming a resist pattern by irradiation with light or electron beams and development; etching the hard mask using the resist pattern; etching the underlayer film using the hard mask patterned; and fabricating the semiconductor substrate using the patterned underlayer film; and as a fifteenth aspect, the method for producing a semiconductor device according to the fourteenth aspect, in which the hard mask is formed by deposition of an inorganic substance.

Effects of the Invention

With the resist underlayer film-forming composition of the present invention, an excellent shape of a resist pattern can be formed without occurrence of intermixing between a top layer portion of a resist underlayer film and a layer that is coated on the top layer portion.

A property of efficiently suppressing reflection from a substrate can be imparted to the resist underlayer film-forming composition of the present invention, and thus the composition can also serve as an anti-reflective coating of exposure light.

The resist underlayer film-forming composition of the present invention can provide an excellent resist underlayer film having a selection ratio of dry etching rate that is close to that of a resist, a selection ratio of dry etching rate that is smaller than that of the resist, or a selection ratio of dry etching rate that is smaller than that of a semiconductor substrate.

As a resist pattern becomes finer, a resist is made thinner in order to prevent the resist pattern from collapsing after development. For such a thin film resist, there are a process that includes transferring a resist pattern onto an underlayer film thereof in an etching process to fabricate a substrate using the underlayer film as a mask, and also a process that includes repeating steps of transferring a resist pattern onto an underlayer film in an etching process and further transferring the pattern transferred on the underlayer film onto an underlayer film thereof using a different gas composition to finally fabricate a substrate. The resist underlayer film and the composition for forming the resist underlayer film of the present invention are effective for such processes and, when a substrate is fabricated with the resist underlayer film of the present invention, exhibit sufficient etching resistance for the fabricated substrate (e.g., a thermal silicon oxide film, a silicon nitride film, or a polysilicon film on the substrate).

The resist underlayer film of the present invention can be used as a planarizing film, a resist underlayer film, an anti-fouling film for resist layers, or a film having dry etching selectivity. This makes it possible to form a resist pattern easily and precisely in a lithography process of semiconductor production.

There is a process that includes forming a resist underlayer film on a substrate using the resist underlayer film-forming composition of the present invention; forming a hard mask thereon; forming a resist film thereon; forming a resist pattern by exposure and development; transferring the resist pattern onto the hard mask; transferring the resist pattern transferred on the hard mask to the resist underlayer film; and fabricating the semiconductor substrate using the resultant resist underlayer film. In this process, the hard mask may be formed out of a coating-type composition that contains an organic polymer and/or an inorganic polymer and a solvent, or may be formed by vacuum deposition of an inorganic substance. The inorganic substance (e.g., silicon oxynitride) forms a deposit on the surface of the resist underlayer film upon vacuum deposition, during which the temperature of the resist underlayer film surface rises to about 400° C. Because the polymer used in the present invention is a polymer containing a unit structure of Formula (1), the resist underlayer film of the present invention has very high heat resistance, and does not undergo thermal degradation even through deposition of deposits.

MODES FOR CARRYING OUT THE INVENTION

The present invention provides a resist underlayer film-forming composition that contains a polymer containing a unit structure of Formula (1).

The present invention also provides a resist underlayer film-forming composition that contains a polymer containing a unit structure of Formula (2).

The former polymer may contain the unit structure of Formula (1) and a unit structure of Formula (3). Furthermore, the latter polymer may contain the unit structure of Formula (2) and a unit structure of Formula (4).

The resist underlayer film-forming composition for lithography contains the polymer and a solvent in the present invention. This composition may contain a cross-linking agent and an acid, and may contain an additive such as an acid generator or a surfactant as necessary. The solid content of the composition is 0.1 to 70% by mass or 0.1 to 60% by mass. The solid content is the content of all components of the resist underlayer film-forming composition excluding the solvent. The solid content may contain the polymer at a proportion of 1 to 100% by mass, 1 to 99.9% by mass, 50 to 99.9% by mass, 50 to 95% by mass, or 50 to 90% by mass.

The polymer used in the present invention has a weight-average molecular weight of 600 to 1,000,000 or 600 to 200,000.

In Formula (1), $R^1$ and $R^2$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined.

In Formula (1), $R^3$ is a hydrogen atom, or a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined.

In Formula (1), $R^4$ is a $C_{6-40}$ aryl group or a heterocyclic group, and the aryl group and the heterocyclic group each are optionally substituted with a halogen group, a nitro group, an amino group, a $C_{1-10}$ alkyl group, a $C_{1-10}$ alkoxy group, a $C_{6-40}$ aryl group, a formyl group, a carboxy group, a carboxylic acid ester group, or a hydroxy group.

In Formula (1), $R^5$ is a hydrogen atom, a $C_{1-10}$ alkyl group, a $C_{6-40}$ aryl group, or a heterocyclic group, and the alkyl group, the aryl group, and the heterocyclic group each are optionally substituted with a halogen group, a nitro group, an amino group, or a hydroxy group, and $R^4$ and $R^5$ optionally form a ring together. X is an O atom, a S atom, a $CH_2$ group, a C=O group, a CH=CH group, or a $CH_2$—$CH_2$ group, n1 and n2 each are an integer of 0 to 3, and m1 and m2 each are an integer of 0 to 3 or an integer of 0 and 1.

In Formula (2), $R^6$ and $R^7$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$R^8$ is a hydrogen atom, or a $C_{1-10}$ alkyl group, a $C_{2-10}$ alkenyl group, a $C_{6-40}$ aryl group, an organic group containing an ether bond, an organic group containing a ketone bond, an organic group containing an ester bond, or a group in which any of these are combined;

$X^2$ is an O atom, a S atom, a $CH_2$ group, a C=O group, a CH=CH group, or a $CH_2$—$CH_2$ group;

$Y^1$ is a divalent group derived from a cycloolefin ring compound;

n3 and n4 each are an integer of 0 to 3; and m3 and m4 each are an integer of 0 to 3.

In Formula (3), $Ar^1$ is a $C_{6-20}$ aromatic ring group; $R^9$ and $R^{10}$ each are a substituent of a hydrogen atom on an aromatic ring, $R^9$ is a hydroxy group, and $R^{10}$ is a halogen group, a nitro group, an amino group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or an organic group in which any of these are combined;

$R^{11}$ is a hydrogen atom, or a $C_{6-40}$ aryl group or a heterocyclic group that is optionally substituted with a halogen group, a nitro group, an amino group, a formyl group, a carboxy group, or a hydroxy group; $R^{12}$ is a hydrogen atom, or a $C_{1-10}$ alkyl group, a $C_{6-40}$ aryl group, or a heterocyclic group that is optionally substituted with a halogen group, a nitro group, an amino group, a formyl group, a carboxy group, or a hydroxy group, and $R^{11}$ and $R^{12}$ optionally form a ring together; n5 is an integer [from one to (the maximum number of substituents that are capable of being substituted with an $Ar^1$ ring)]; and n6 is an integer [from ((the maximum number of substituents that are capable of being substituted with the $Ar^1$ ring)−n5) to zero])

In Formula (4), $Ar^2$ is a $C_{6-20}$ aromatic ring group; $R^{13}$ and $R^{14}$ each are a substituent of a hydrogen atom on an aromatic ring, $R^{13}$ is a hydroxy group, and $R^{14}$ is a halogen group, a nitro group, an amino group, a $C_{1-10}$ alkyl group, a $C_{2-10}$ alkenyl group, a $C_{6-40}$ aryl group, an organic group containing an ether bond, an organic group containing a ketone bond, an organic group containing an ester bond, or an organic group in which any of these are combined; $Y^2$ is a divalent group derived from a cycloolefin ring compound;

n7 is an integer [from one to (the maximum number of substituents that are capable of being substituted with an $Ar^2$ ring)]; and n8 is an integer [from ((the maximum number of substituents that are capable of being substituted with the $Ar^2$ ring)−n7) to zero]).

Examples of the halogen group include a fluorine atom, a chlorine atom, a bromine atom, and an iodine atom. Examples of the $C_{1-10}$ alkyl group include a methyl group, an ethyl group, an n-propyl group, an i-propyl group, a cyclopropyl group, an n-butyl group, an i-butyl group, an s-butyl group, a t-butyl group, a cyclobutyl group, a 1-methyl-cyclopropyl group, a 2-methyl-cyclopropyl group, an n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, an n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, and a 2-ethyl-3-methyl-cyclopropyl group.

Examples of the $C_{2-10}$ alkenyl group include an ethenyl group, a 1-propenyl group, a 2-propenyl group, a 1-methyl-1-ethenyl group, a 1-butenyl group, a 2-butenyl group, a 3-butenyl group, a 2-methyl-1-propenyl group, a 2-methyl-2-propenyl group, a 1-ethylethenyl group, a 1-methyl-1-propenyl group, a 1-methyl-2-propenyl group, a 1-pentenyl group, a 2-pentenyl group, a 3-pentenyl group, a 4-pentenyl group, a 1-n-propylethenyl group, a 1-methyl-1-butenyl group, a 1-methyl-2-butenyl group, a 1-methyl-3-butenyl group, a 2-ethyl-2-propenyl group, a 2-methyl-1-butenyl group, a 2-methyl-2-butenyl group, a 2-methyl-3-butenyl group, a 3-methyl-1-butenyl group, a 3-methyl-2-butenyl group, a 3-methyl-3-butenyl group, a 1,1-dimethyl-2-propenyl group, a 1-i-propylethenyl group, a 1,2-dimethyl-1-propenyl group, a 1,2-dimethyl-2-propenyl group, a 1-cyclopentenyl group, a 2-cyclopentenyl group, a 3-cyclopentenyl group, a 1-hexenyl group, a 2-hexenyl group, a 3-hexenyl group, a 4-hexenyl group, a 5-hexenyl group, a 1-methyl-1-pentenyl group, a 1-methyl-2-pentenyl group, a 1-methyl-3-pentenyl group, a 1-methyl-4-pentenyl group, a 1-n-butylethenyl group, a 2-methyl-1-pentenyl group, a 2-methyl-2-pentenyl group, a 2-methyl-3-pentenyl group, a 2-methyl-4-pentenyl group, a 2-n-propyl-2-propenyl group, a 3-methyl-1-pentenyl group, a 3-methyl-2-pentenyl group, a 3-methyl-3-pentenyl group, a 3-methyl-4-pentenyl group, a 3-ethyl-3-butenyl group, a 4-methyl-1-pentenyl group, a 4-methyl-2-pentenyl group, a 4-methyl-3-pentenyl group, a 4-methyl-4-pentenyl group, a 1,1-dimethyl-2-butenyl group, a 1,1-dimethyl-3-butenyl group, a 1,2-dimethyl-1-butenyl group, a 1,2-dimethyl-2-butenyl group, a 1,2-dimethyl-3-butenyl group, a 1-methyl-2-ethyl-2-propenyl group, a 1-s-butylethenyl group, a 1,3-dimethyl-1-butenyl group, a 1,3-dimethyl-2-butenyl group, a 1,3-dimethyl-3-butenyl group, a 1-i-butylethenyl group, a 2,2-dimethyl-3-butenyl group, a 2,3-dimethyl-1-butenyl group, a 2,3-dimethyl-2-butenyl group, a 2,3-dimethyl-3-butenyl group, a 2-i-propyl-2-propenyl group, a 3,3-dimethyl-1-butenyl group, 1-ethyl-1-butenyl group, a 1-ethyl-2-butenyl group, a 1-ethyl-3-butenyl group, a 1-n-propyl-1-propenyl group, a 1-n-propyl-2-propenyl group, a 2-ethyl-1-butenyl group, a 2-ethyl-2-butenyl group, a 2-ethyl-3-butenyl group, a 1,1,2-trimethyl-2-propenyl group, a 1-t-butylethenyl group, a 1-methyl-1-ethyl-2-propenyl group, a 1-ethyl-2-methyl-1-propenyl group, a 1-ethyl-2-methyl-2-propenyl group, a 1-i-propyl-1-propenyl group, a 1-i-propyl-2-propenyl group, a 1-methyl-2-cyclopentenyl group, a 1-methyl-3-cyclopentenyl group, a 2-methyl-1-cyclopentenyl group, a 2-methyl-2-cyclopentenyl group, a 2-methyl-3-cyclopentenyl group, a 2-methyl-4-cyclopentenyl group, a 2-methyl-5-cyclopentenyl group, a 2-methylene-cyclopentyl group, a 3-methyl-1-cyclopentenyl group, a 3-methyl-2-cyclopentenyl group, a 3-methyl-3-cyclopentenyl group, a 3-methyl-4-cyclopentenyl group, a 3-methyl-5-cyclopentenyl group, a 3-methylene-cyclopentyl group, a 1-cyclohexenyl group, a 2-cyclohexenyl group, and a 3-cyclohexenyl group.

Examples of the $C_{6-40}$ aryl group include a phenyl group, an o-methylphenyl group, an m-methylphenyl group, a p-methylphenyl group, an o-chlorophenyl group, an m-chlorophenyl group, a p-chlorophenyl group, an o-fluorophenyl group, a p-fluorophenyl group, an o-methoxyphenyl group, a p-methoxyphenyl group, a p-nitrophenyl group, a p-cyanophenyl group, an α-naphthyl group, a β-naphthyl group, an o-biphenylyl group, an m-biphenylyl group, a p-biphenylyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

The heterocyclic group is preferably an organic group including a five- to six-membered heterocyclic ring containing nitrogen, sulfur, and oxygen, and examples thereof include a pyrrole group, a furan group, a thiophene group, an imidazole group, an oxazole group, a thiazole group, a pyrazole group, an isoxazole group, an isothiazole group, and a pyridine group.

Examples of the divalent group derived from a cycloolefin ring compound include divalent groups derived from norbornadiene, dicyclopentadiene, tetracyclo[4.4.0.12,5.17,10]dodeca-3,8-diene, and substituted tetracyclo[4.4.0.12,5.17,10]dodeca-3,8-diene.

A repeating unit structure in the case where $R^3$ is a hydrogen atom in Formula (1) may be used. A repeating unit structure in the case where both n1 and n2 are zero in Formula (1) may be used. The case where $R^1$, $R^2$, $R^3$, and $R^5$ each are a hydrogen atom and $R^4$ is a benzene ring, a naphthalene ring, or a pyrene ring in Formula (1) may be preferably used. A case where $R^5$ and $R^4$ form a ring together to form a fluorene structure is also preferred.

A repeating unit structure in the case where $R^8$ is a hydrogen atom in Formula (2) may be used. A repeating unit structure in the case where both n3 and n4 are zero in Formula (2) may be used.

A novolak resin containing a heterocyclic ring used in the present invention is a novolak resin that is obtained by condensing a heterocyclic group-containing aromatic compound, such as phenothiazine or phenoxazine, having a structure in which X is a sulfur atom or an oxygen atom in the unit structure of Formula (1) with aldehydes or ketones, and the heterocyclic group-containing aromatic compound may be used alone or in combination of two or more types thereof.

A copolymer resin containing a heterocyclic ring used in the invention of the present application is a copolymer resin of a cycloolefin ring compound and a heterocyclic group-containing aromatic compound, such as phenothiazine or phenoxazine, having a structure in which $X^2$ is a sulfur atom or an oxygen atom in the unit structure of Formula (2), and the heterocyclic group-containing aromatic compound may be used alone or in combination of two or more types thereof.

In production of the polymer of the present invention, to produce the polymer containing the unit structure of Formula (1) and the unit structure of Formula (3), or the polymer containing the unit structure of Formula (2) and the unit structure of Formula (4), a hydroxy group-containing aromatic compound may be used. Examples thereof include phenol, dihydroxybenzene, trihydroxybenzene, naphthol, dihydroxynaphthalene, trihydroxynaphthalene, hydroxyanthracene, dihydroxyanthracene, and trihydroxyanthracene.

Examples of the aldehydes used for producing the polymer of the present invention include saturated aliphatic aldehydes such as formaldehyde, paraformaldehyde, acetaldehyde, propylaldehyde, butyraldehyde, isobutyraldehyde, valeraldehyde, capronaldehyde, 2-methylbutyraldehyde, hexanal, undecanal, 7-methoxy-3,7-dimethyloctyl aldehyde, cyclohexanal, 3-methyl-2-butyraldehyde, glyoxal, malonaldehyde, succinaldehyde, glutaraldehyde, glutaraldehyde, and adipaldehyde; unsaturated aliphatic aldehydes such as acrolein and methacrolein; heterocyclic aldehydes such as furfural and pyridine aldehyde; and aromatic aldehydes such as benzaldehyde, naphthylaldehyde, anthrylaldehyde, phenanthrylaldehyde, salicylaldehyde, phenylacetaldehyde, 3-phenylpropionaldehyde, tolylaldehyde, (N,N-dimethylamino)benzaldehyde, acetoxybenzaldehyde, and 1-pyrenecarboxyaldehyde. In particular, the aromatic aldehydes can be preferably used.

As the ketones used for producing the polymer of the present invention, diaryl ketones are used, and examples thereof include diphenyl ketone, phenyl naphthyl ketone, dinaphthyl ketone, phenyl tolyl ketone, ditolyl ketone, and 9-fluorenone.

The polymer used in the present invention is a novolak resin obtained by condensing a heterocyclic group-containing aromatic compound with aldehydes or ketones. In this condensation reaction, aldehydes or ketones can be used in an amount of 0.1 to 10 equivalents per equivalent of phenyl groups that are included in the heterocyclic group-containing aromatic compound and involved in the reaction.

Examples of an acid catalyst used in the condensation reaction include mineral acids such as sulfuric acid, phosphoric acid, and perchloric acid; organic sulfonic acids such as p-toluenesulfonic acid and p-toluenesulfonic acid monohydrate; and carboxylic acids such as formic acid and oxalic acid. The use amount of the acid catalyst is variously selected depending on the type of an acid to be used. Generally, the amount is 0.001 to 10,000 parts by mass, preferably 0.01 to 1,000 parts by mass, and more preferably 0.1 to 100 parts by mass with respect to 100 parts by mass of the heterocyclic group-containing aromatic compound.

The condensation reaction may be performed without a solvent, but is generally performed with a solvent. Any solvent can be used as long as it does not inhibit the reaction. Examples of the solvent include cyclic ethers such as tetrahydrofuran and dioxane. If the acid catalyst used is a liquid acid such as formic acid, the catalyst can also serve as the solvent. The reaction temperature during condensation is generally 40° C. to 200° C. The reaction time is variously selected depending on the reaction temperature, but is generally about 30 minutes to 50 hours.

The weight-average molecular weight Mw of the polymer thus obtained is generally 500 to 1,000,000, or 600 to 200,000.

Alternatively, the polymer used in the present invention is a copolymer resin of a heterocyclic group-containing aromatic compound and a cycloolefin ring compound. Examples of the acid catalyst for this reaction include mineral acids such as sulfuric acid, phosphoric acid, and perchloric acid; organic sulfonic acids such as p-toluenesulfonic acid, p-toluenesulfonic acid monohydrate, and trifluoromethanesulfonic acid; and carboxylic acids such as formic acid and oxalic acid. The use amount of the acid catalyst is variously selected depending on the type of an acid to be used. Generally, the amount is 0.001 to 10,000 parts by mass, preferably 0.01 to 1,000 parts by mass, and more preferably 0.1 to 100 parts by mass with respect to 100 parts by mass of the heterocyclic group-containing aromatic compound. The reaction may be performed without a solvent, but is generally performed with a solvent. Any solvent can be used as long as it does not inhibit the reaction. Examples of the solvent include cyclic ethers such as tetrahydrofuran and dioxane and butyl cellosolve. If the acid catalyst used is a liquid acid such as formic acid, the catalyst can also serve as the solvent. The reaction temperature is generally 40° C. to 200° C. The reaction time is variously selected depending on the reaction temperature, but is generally about 30 minutes to 50 hours. The weight-average molecular weight Mw of the polymer thus obtained is generally 500 to 1,000,000, or 600 to 200,000.

Examples of the cycloolefin ring compound used for producing the polymer of the present invention include norbornadiene, dicyclopentadiene, tetracyclo[4.4.0.12,5.17,10]dodeca-3,8-diene, and substituted tetracyclo[4.4.0.12,5.17,10]dodeca-3,8-diene.

The polymer containing the unit structure of Formula (1), the polymer containing the unit structure of Formula (1) and the unit structure of Formula (3), the polymer containing the unit structure of Formula (2), and the polymer containing the unit structure of Formula (2) and the unit structure of Formula (4) are exemplified as follows.

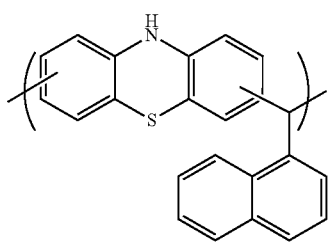

Formula (2-1)

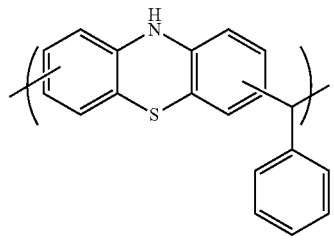

Formula (2-2)

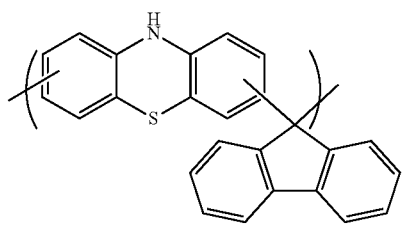

Formula (2-3)

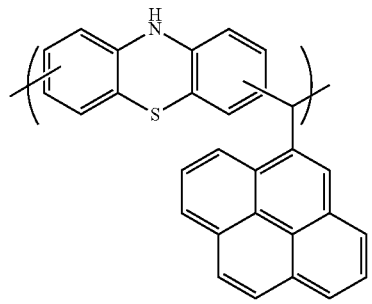

Formula (2-4)

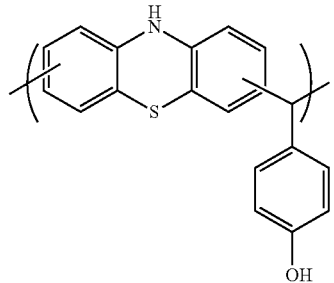

Formula (2-5)

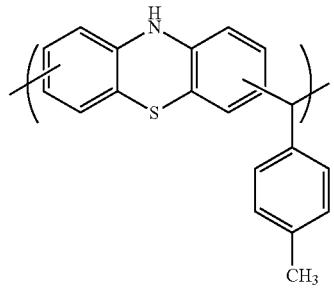

Formula (2-6)

Formula (2-7)
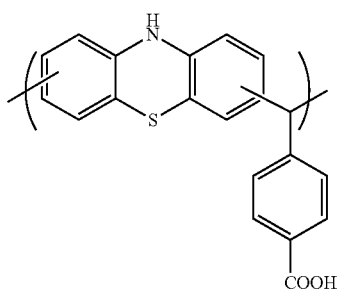
Formula (2-8)
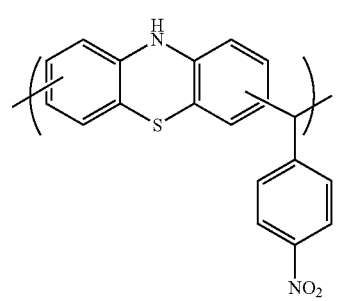
Formula (2-9)
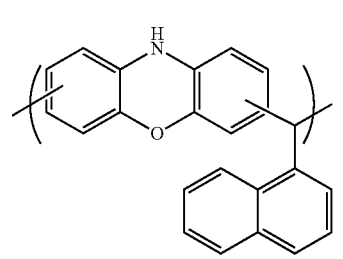
Formula (2-10)
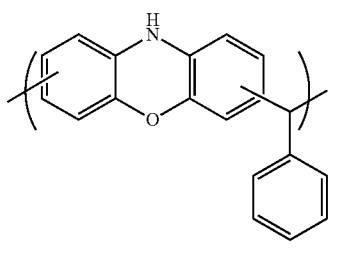
Formula (2-11)
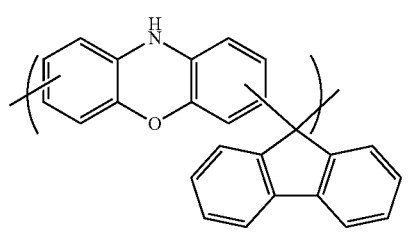
Formula (2-12)
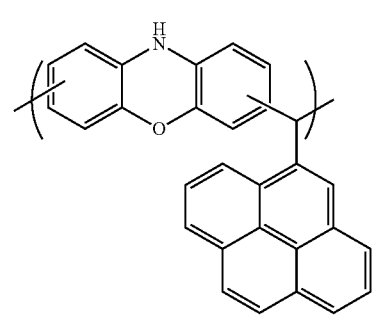
Formula (2-13)
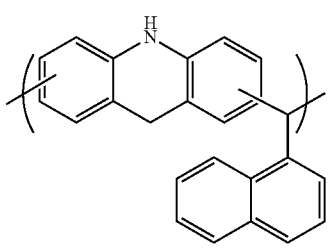
Formula (2-14)
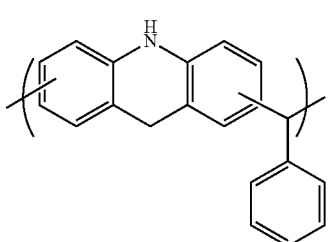
Formula (2-15)
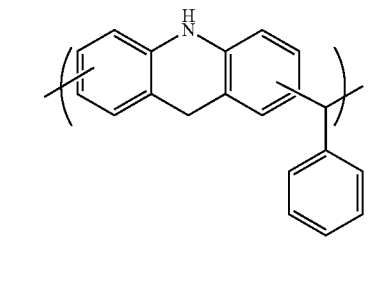
Formula (2-16)
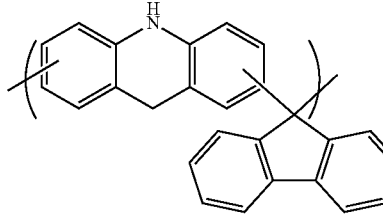
Formula (2-17)
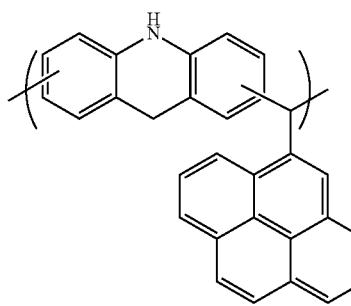
Formula (2-18)
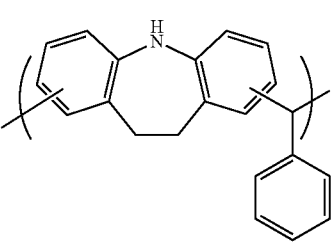

-continued
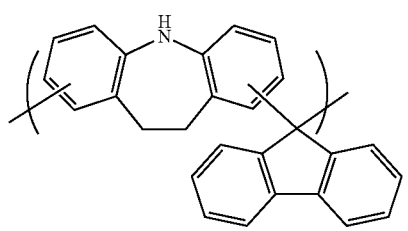
Formula (2-19)
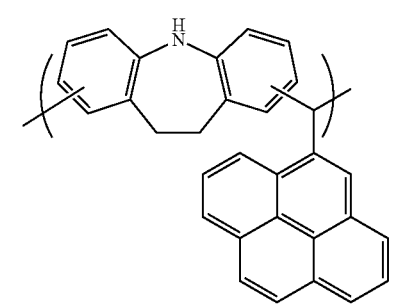
Formula (2-20)
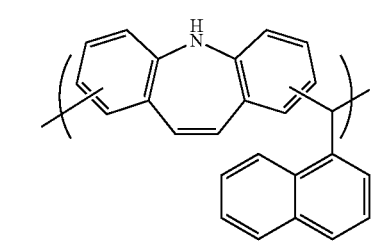
Formula (2-21)
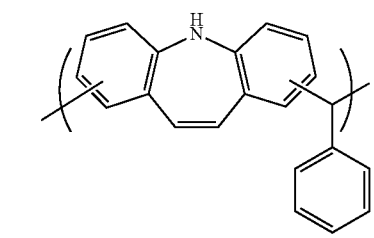
Formula (2-22)
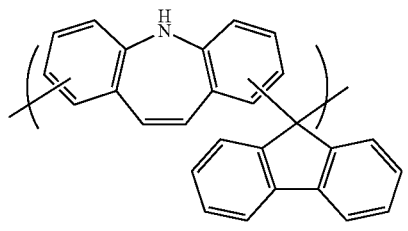
Formula (2-23)
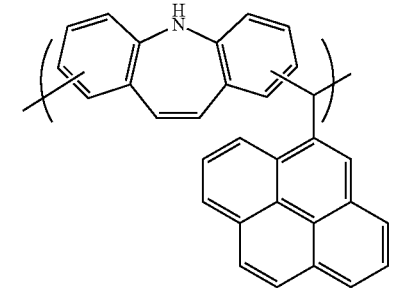
Formula (2-24)
-continued
Formula (2-25)
Formula (2-6)
Formula (2-27)
Formula (2-28)
Formula (2-29)
Formula (2-30)

-continued

Formula (2-31)
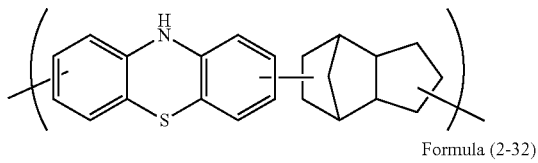

Formula (2-32)
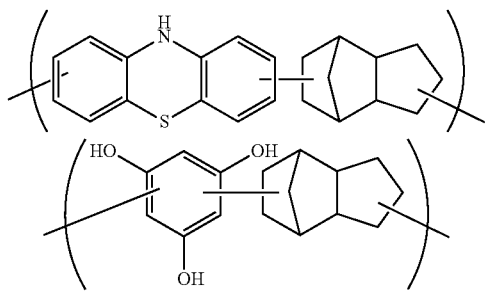

Formula (2-33)
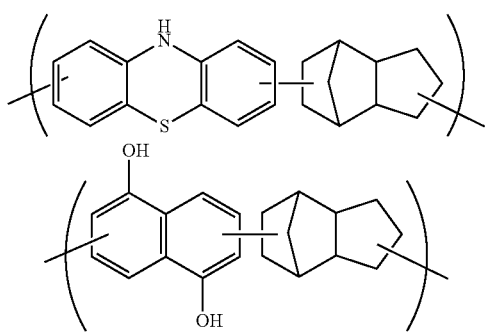

The polymer can be used by being mixed with another polymer at a content of 30% by mass or less in the total polymers.

Examples of the other polymer include polyacrylic acid ester compounds, polymethacrylic acid ester compounds, polyacrylamide compounds, polymethacrylamide compounds, polyvinyl compounds, polystyrene compounds, polymaleimide compounds, polymaleic acid anhydride, and polyacrylonitrile compounds.

Examples of raw material monomers of the polyacrylic acid ester compounds include methyl acrylate, ethyl acrylate, isopropyl acrylate, benzyl acrylate, naphthyl acrylate, anthryl acrylate, anthrylmethyl acrylate, phenyl acrylate, 2-hydroxyethyl acrylate, 2-hydroxypropyl acrylate, 2,2,2-trifluoroethyl acrylate, 4-hydroxybutyl acrylate, isobutyl acrylate, tert-butyl acrylate, cyclohexyl acrylate, isobornyl acrylate, 2-methoxyethyl acrylate, methoxytriethylene glycol acrylate, 2-ethoxyethyl acrylate, tetrahydrofurfuryl acrylate, 3-methoxybutyl acrylate, 2-methyl-2-adamantyl acrylate, 2-ethyl-2-adamantyl acrylate, 2-propyl-2-adamantyl acrylate, 2-methoxybutyl-2-adamantyl acrylate, 8-methyl-8-tricyclodecyl acrylate, 8-ethyl-8-tricyclodecyl acrylate, and 5-acryloyloxy-6-hydroxynorbornene-2-carboxylic-6-lactone.

Examples of raw material monomers of the polymethacrylic acid ester compounds include ethyl methacrylate, n-propyl methacrylate, n-pentyl methacrylate, cyclohexyl methacrylate, benzyl methacrylate, naphthyl methacrylate, anthryl methacrylate, anthrylmethyl methacrylate, phenyl methacrylate, 2-phenylethyl methacrylate, 2-hydroxyethyl methacrylate, 2-hydroxypropyl methacrylate, 2,2,2-trifluoroethyl methacrylate, 2,2,2-trichloroethyl methacrylate, methyl acrylate, isobutyl methacrylate, 2-ethylhexyl methacrylate, iso-decyl methacrylate, n-lauryl methacrylate, n-stearyl methacrylate, methoxydiethylene glycol methacrylate, methoxypolyethylene glycol methacrylate, tetrahydrofurfuryl methacrylate, isobornyl methacrylate, tert-butyl methacrylate, isostearyl methacrylate, n-butoxyethyl methacrylate, 3-chloro-2-hydroxypropyl methacrylate, 2-methyl-2-adamantyl methacrylate, 2-ethyl-2-adamantyl methacrylate, 2-propyl-2-adamantyl methacrylate, 2-methoxybutyl-2-adamantyl methacrylate, 8-methyl-8-tricyclodecyl methacrylate, 8-ethyl-8-tricyclodecyl methacrylate, 5-methacryloyloxy-6-hydroxy-norbornene-2-carboxylic-6-lactone, and 2,2,3,3,4,4,4-heptafluorobutyl methacrylate.

Examples of raw material monomers of the polyacrylamide compounds include acrylamide, N-methyl acrylamide, N-ethyl acrylamide, N-benzyl acrylamide, N-phenyl acrylamide, and N,N-dimethyl acrylamide.

Examples of raw material monomers of polymethacrylic acid amide compounds include methacrylamide, N-methyl methacrylamide, N-ethyl methacrylamide, N-benzyl methacrylamide, N-phenyl methacrylamide, and N,N-dimethyl methacrylamide.

Examples of raw material monomers of the polyvinyl compounds include vinyl ether, methyl vinyl ether, benzylvinyl ether, 2-hydroxyethylvinyl ether, phenylvinyl ether, and propylvinyl ether.

Examples of raw material monomers of the polystyrene compounds include styrene, methylstyrene, chlorostyrene, bromostyrene, and hydroxystyrene.

Examples of raw material monomers of the polymaleimide compounds include maleimide, N-methylmaleimide, N-phenylmaleimide, and N-cyclohexylmaleimide.

These polymers can be produced by dissolving, in an organic solvent, addition-polymerizable monomers and a chain transfer agent (10% or less with respect to the mass of monomers) that is added as necessary, adding a polymerization initiator to perform polymerization reaction, and then adding a polymerization terminator to terminate the reaction. The addition amount of the polymerization initiator is 1 to 10% with respect to the mass of monomers, and the addition amount of the polymerization terminator is 0.01 to 0.2% by mass. Examples of the organic solvent used include propylene glycol monomethyl ether, propylene glycol monopropyl ether, ethyl lactate, cyclohexanone, methyl ethyl ketone, dimethylformamide or the like. Examples of the chain transfer agent include dodecanethiol and dodecylthiol. Examples of the polymerization initiator include azobisisobutyronitrile and azobiscyclohexanecarbonitrile. Examples of the polymerization terminator include 4-methoxyphenol. The reaction temperature is appropriately selected from a range from 30 to 100° C., and the reaction time is appropriately selected from a range from 1 to 48 hours.

The resist underlayer film-forming composition of the present invention may contain a cross-linking agent component. Examples of the cross-linking agent include melamine-based agents, substituted urea-based agents, and polymer-based agents thereof. Preferred cross-linking agents have at least two cross-link forming substituents, and examples of the cross-linking agents include compounds such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, and methoxymethylated thiourea. Condensation products of these compounds can also be used.

A cross-linking agent having high heat resistance can be used as the cross-linking agent. As the cross-linking agent having high heat resistance, a compound containing a cross-link forming substituent having an aromatic ring (e.g., a benzene ring or a naphthalene ring) in the molecule can be preferably used.

Examples of this compound include compounds having a partial structure of Formula (5) below, and polymers or oligomers having a repeating unit of Formula (6) below.

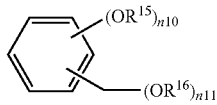

Formula (5)

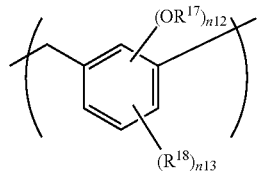

Formula (6)

In Formula (5), $R^{15}$ and $R^{16}$ each are a hydrogen atom, a $C_{1-10}$ alkyl group, or a $C_{6-20}$ aryl group; n10 is an integer of 1 to 4; n11 is an integer of 1 to (5-n10); and (n10+n11) is an integer of 2 to 5.

In Formula (6), $R^{17}$ is a hydrogen atom or a $C_{1-10}$ alkyl group; $R^{18}$ is a $C_{1-10}$ alkyl group; n12 is an integer of 1 to 4; n13 is 0 to (4-n12); and (n12+n13) is an integer of 1 to 4. The number of repeating unit structures of oligomers and polymers that can be used is in a range of 2 to 100 or 2 to 50.

The alkyl group and the aryl group herein can be exemplified by the alkyl groups and the aryl groups described above.

The compounds, polymers, and oligomers of Formula (5) and Formula (6) are exemplified as follows.

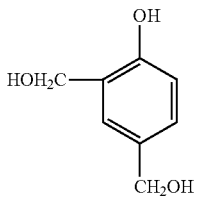

Formula (3-1)

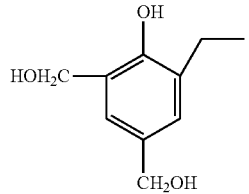

Formula (3-2)

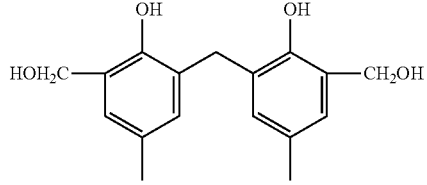

Formula (3-3)

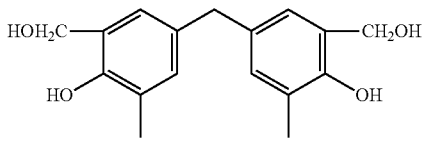

Formula (3-4)

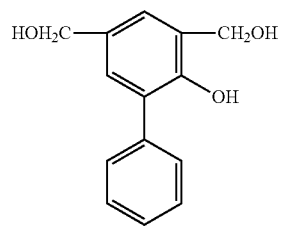

Formula (3-5)

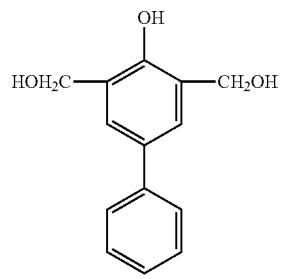

Formula (3-6)

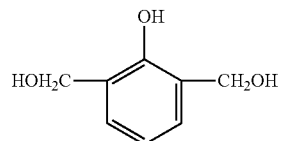

Formula (3-7)

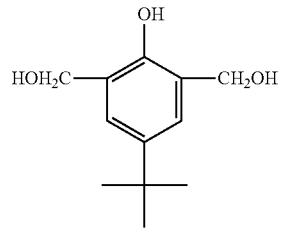

Formula (3-8)

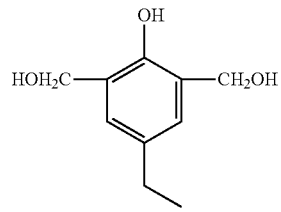

Formula (3-9)

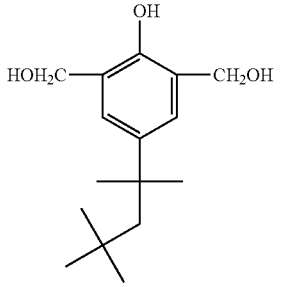

Formula (3-10)

Formula (3-11)
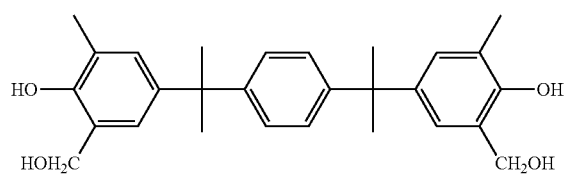
Formula (3-12)
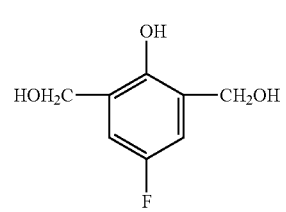
Formula (3-13)
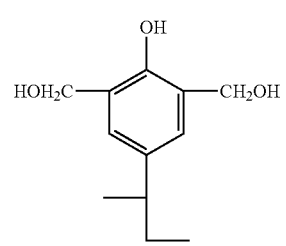
Formula (3-14)
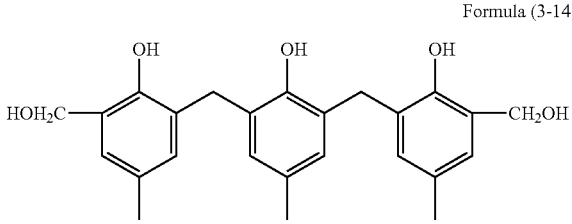
Formula (3-15)
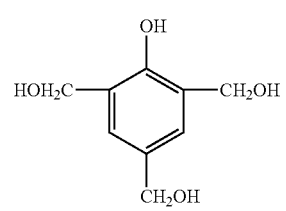
Formula (3-16)
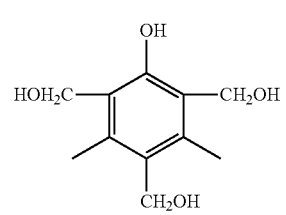
Formula (3-17)
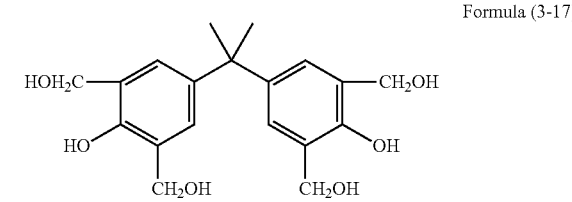
Formula (3-18)
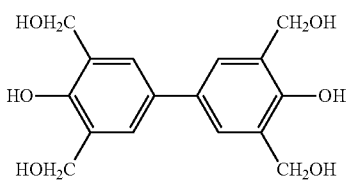
Formula (3-19)
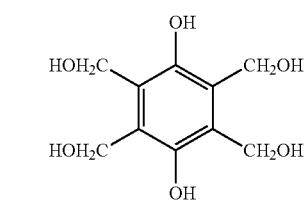
Formula (3-20)
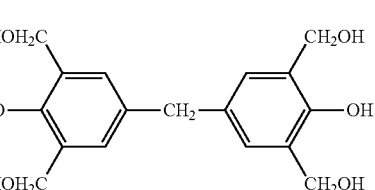
Formula (3-21)
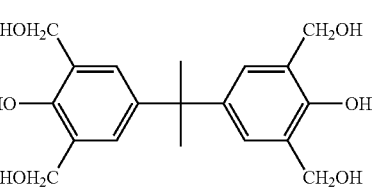
Formula (3-22)
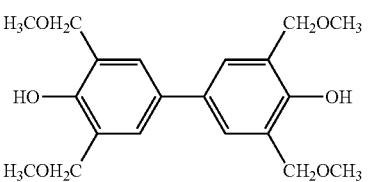
Formula (3-23)
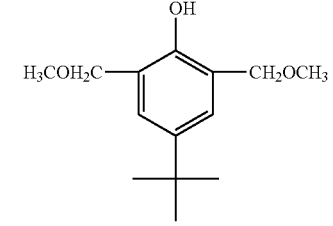
Formula (3-24)
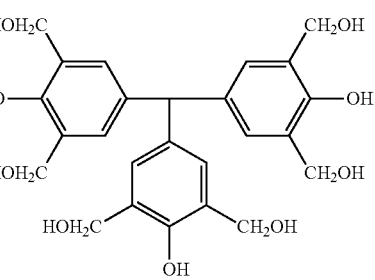

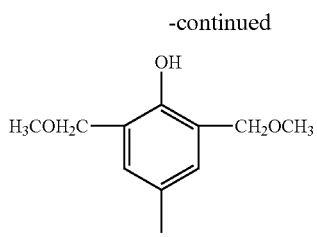

Formula (3-25)

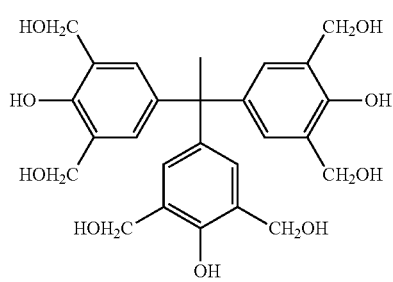

Formula (3-26)

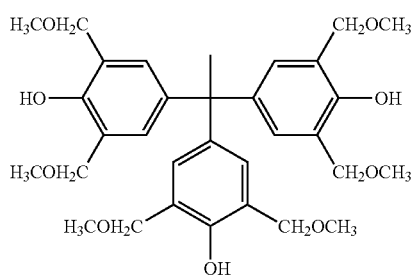

Formula (3-27)

These compounds are available as products of Asahi Organic Chemicals Industry Co., Ltd. and Honshu Chemical Industry Co., Ltd. For example, the compound of Formula (3-21) among the cross-linking agents is available as TM-BIP-A (trade name) from Asahi Organic Chemicals Industry Co., Ltd.

The addition amount of the cross-linking agent depends on a solvent used for application, an underlying substrate used, a solution viscosity required, and a film shape required, for example, and is 0.001 to 80% by mass, preferably 0.01 to 50% by mass, and more preferably 0.05 to 40% by mass with respect to the total solid contents. These cross-linking agents may cause cross-linking reaction by self-condensation but, when a cross-linkable substituent exists in the polymer of the present invention, the cross-linking agents can cause cross-linking reaction with the cross-linkable substituent.

In the present invention, as a catalyst for promoting the cross-linking reaction, an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, or naphthalenecarboxylic acid; and/or a thermal acid generator such as 2,4,4,6-tetrabromocyclohexadienone, benzoin tosylate, 2-nitrobenzyl tosylate, or other organic sulfonic acid alkyl esters can be blended. The blending amount of the catalyst is 0.0001 to 20% by mass, preferably 0.0005 to 10% by mass, and preferably 0.01 to 3% by mass with respect to the total solid contents.

A photoacid generator can be added to the coating-type resist underlayer film-forming composition for lithography of the present invention in order to match the acidity with that of a photoresist that is coated on the upper layer in a lithography step. Examples of the photoacid generator preferred include onium salt-based photoacid generators such as bis(4-t-butylphenyl)iodonium trifluoromethanesulfonate and triphenyl sulfonium trifluoromethanesulfonate; halogen-containing compound-based photoacid generators such as phenyl-bis(trichloromethyl)-s-triazine; and sulfonic acid-based photoacid generators such as benzoin tosylate and N-hydroxysuccinimide trifluoromethanesulfonate. The addition amount of the photoacid generator is 0.2 to 10% by mass, and preferably 0.4 to 5% by mass with respect to the total solid contents.

A light absorber, a rheology control agent, an adhesion assistant, and a surfactant, for example, other than the agents above can be further added as necessary to the resist underlayer film material for lithography of the present invention. Examples of such an additional light absorber include commercially available light absorbers described in "Kogyo-yo Shikiso no Gijutsu to Shijo (Technology and Market of Industrial Dyes)" (CMC Publishing) or "Senryo Binran (Handbook for Dyes)" (edited by The Society of Synthetic Organic Chemistry, Japan). For example, C. I. Disperse Yellow 1, 3, 4, 5, 7, 8, 13, 23, 31, 49, 50, 51, 54, 60, 64, 66, 68, 79, 82, 88, 90, 93, 102, 114, and 124; C. I. Disperse Orange 1, 5, 13, 25, 29, 30, 31, 44, 57, 72, and 73; C. I. Disperse Red 1, 5, 7, 13, 17, 19, 43, 50, 54, 58, 65, 72, 73, 88, 117, 137, 143, 199, and 210; C. I. Disperse Violet 43; C. I. Disperse Blue 96; C. I. Fluorescent Brightening Agent 112, 135, and 163; C. I. Solvent Orange 2 and 45; C. I. Solvent Red 1, 3, 8, 23, 24, 25, 27, and 49; C. I. Pigment Green 10; and C. I. Pigment Brown 2 can be suitably used.

These light absorbers are generally blended in a proportion of 10% by mass or less, and preferably 5% by mass or less, with respect to the total solids of the resist underlayer film material for lithography.

The rheology control agent is added mainly for the purpose of improving the flowability of the resist underlayer film-forming composition and, particularly in a baking step, improving the film thickness uniformity of the resist underlayer film and enhancing the filling ability of the resist underlayer film-forming composition into holes. Specific examples of the rheology control agent include phthalic acid derivatives such as dimethyl phthalate, diethyl phthalate, diisobutyl phthalate, dihexyl phthalate, and butylisodecyl phthalate; adipic acid derivatives such as di-n-butyl adipate, diisobutyl adipate, diisooctyl adipate, and octyl decyl adipate; maleic acid derivatives such as di-n-butyl maleate, diethyl maleate, and dinonyl maleate; oleic acid derivatives such as methyl oleate, butyl oleate, and tetrahydrofurfuryl oleate; or stearic acid derivatives such as n-butyl stearate, and glyceryl stearate. These rheology control agents are generally blended in a proportion smaller than 30% by mass with respect to the total solid contents of the resist underlayer film material for lithography.

The adhesion assistant is added mainly for the purpose of improving the adhesiveness between the substrate or the resist and the resist underlayer film-forming composition, and particularly preventing the resist from peeling off during development. Specific examples of the adhesion assistant include chlorosilanes such as trimethylchlorosilane, dimethylvinylchlorosilane, methyldiphenylchlorosilane, and chloromethyldimethylchlorosilane; alkoxysilanes such as trimethylmethoxysilane, dimethyldiethoxysilane, methyldimethoxysilane, dimethylvinylethoxysilane, diphenyldimethoxysilane, and phenyltriethoxysilane; silazanes such as hexamethyldisilazane, N,N'-bis(trimethylsilyl)urea, dimethyltrimethylsilylamine, and trimethylsilylimidazole; silanes such as vinyltrichlorosilane, γ-chloropropyltrimethoxysilane, γ-aminopropyltriethoxysilane, and γ-glycidoxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracil, mercaptoimidazole, and mercaptopyrimidine; urea such as 1,1-dimethylurea and 1,3-dimethylurea; and thiourea compounds.

These adhesion assistants are generally added in a proportion smaller than 5% by mass, and preferably smaller than 2% by mass with respect to the total solid contents of the resist underlayer film material for lithography.

A surfactant can be blended into the resist underlayer film material for lithography of the present invention in order to further improve coating properties against surface irregularities without occurrence of pinholes or striations, for example. Examples of the surfactant include nonionic surfactants including polyoxyethylene alkyl ethers such as polyoxyethylene lauryl ether, polyoxyethylene stearyl ether, polyoxyethylene cetyl ether, and polyoxyethylene oleyl ether; polyoxyethylene alkylallyl ethers such as polyoxyethylene octylphenol ether and polyoxyethylene nonylphenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine based surfactants including EFTOP EF301, EF303, EF352 (manufactured by Tohkem Products Corp., trade names), MEGAFAC F171, F173, R-30 (manufactured by Dainippon Ink and Chemicals, Inc., trade names), FLUORAD FC430, FC431 (manufactured by Sumitomo 3M Ltd., trade names), ASAHI GUARD AG710, and SURFLON S-382, SC101, SC102, SC103, SC104, SC105, SC106 (manufactured by Asahi Glass Co., Ltd., trade names); and an organosiloxane polymer KP341 (manufactured by Shin-Etsu Chemical Co., Ltd.). The blending amount of these surfactants is generally 2.0% by mass or less, and preferably 1.0% by mass or less with respect to the total solid contents of the resist underlayer film material for lithography of the present invention. These surfactants may be added alone or may be added in combination of two or more types.

In the present invention, examples of usable solvents that dissolve polymers, cross-linking agent components, and cross-linking catalysts, for example, described above include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol monoethyl ether, propylene glycol monoethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, and butyl lactate. These organic solvents are used alone or in combination of two or more types.

High-boiling point solvents such as propylene glycol monobutyl ether and propylene glycol monobutyl ether acetate can be mixed to be used. Among these solvents, propylene glycol monomethyl ether, propylene glycol monomethyl ether acetate, ethyl lactate, butyl lactate, and cyclohexanone, for example, are preferably used to improve leveling properties.

The resist used in the present invention is a photoresist or an electron beam resist.

As the photoresist that is applied onto the resist underlayer film for lithography of the present invention, both a positive photoresist and a negative photoresist can be used. The photoresist may be, for example, a positive photoresist including a novolak resin and 1,2-naphthoquinone diazide sulfonic acid ester; a chemically amplified photoresist including a photoacid generator and a binder having a group that is decomposed by an acid to increase the alkali dissolution rate; a chemically amplified photoresist including an alkali-soluble binder, a low molecular compound that is decomposed by an acid to increase the alkali dissolution rate of the photoresist, and a photoacid generator; a chemically amplified photoresist including a binder having a group that is decomposed by an acid to increase the alkali dissolution rate, a low molecular compound that is decomposed by an acid to increase the alkali dissolution rate of the photoresist, and a photoacid generator; or a photoresist including an Si atom in the skeleton. Examples of the photoresist include APEX-E (trade name) manufactured by Rohm and Haas Co.

Examples of the electron beam resist applied onto the resist underlayer film for lithography of the present invention include a composition made up of a resin that includes an Si—Si bond in a main chain and includes an aromatic ring at an end and of an acid generator that generates an acid by irradiation with electron beams; and a composition made up of a polyp-hydroxystyrene) in which a hydroxy group is substituted with an organic group containing N-carboxyamine and of an acid generator that generates an acid by irradiation with electron beams. In the latter electron beam resist composition, the acid generated from the acid generator by electron beam irradiation reacts with the N-carboxyaminoxy group on a side chain of the polymer, then the polymer side chain decomposes into hydroxy groups, and the polymer becomes alkali-soluble and dissolves in an alkaline developer to form a resist pattern. Examples of the acid generator that generates an acid by irradiation with electron beams include halogenated organic compounds such as 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane, and 2-chloro-6-(trichloromethyl)pyridine; onium salts such as a triphenyl sulfonium salt and a diphenyl iodonium salt; and sulfonic acid esters such as nitrobenzyl tosylate and dinitrobenzyl tosylate.

As the developer for a resist having a resist underlayer film that is formed using the resist underlayer film material for lithography of the present invention, aqueous solutions of alkalis including inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide, tetraethylammonium hydroxide, and choline; and cyclic amines such as pyrrole and piperidine can be used. An alcohol such as isopropyl alcohol or a surfactant such as a nonionic surfactant can be added to these aqueous alkaline solutions in appropriate amount for use. Among these developers, the quaternary ammonium salts are preferred, and tetramethylammonium hydroxide and choline are more preferred.

The method for forming a resist pattern of the present invention will be described below. The resist underlayer film-forming composition is applied onto a substrate (e.g., a transparent substrate such as a silicon/silicon dioxide coat, a glass substrate, or an ITO substrate) that is used in the production of precision integrated circuit elements by an appropriate coating method using a spinner or a coater, for example, and then is cured by baking to prepare a coating-type underlayer film. The thickness of the resist underlayer film is preferred to be 0.01 to 3.0 μm. As conditions of the baking after the application, the temperature is 80 to 350° C., and the period of time is 0.5 to 120 minutes. Subsequently, a resist is applied directly onto the resist underlayer film or, as necessary, onto a film formed by applying one to several layers of coating film material onto a coating-type resist underlayer film. Light or electron beams is radiated thereon via a predetermined mask, and then development, rinsing, and drying are performed, whereby a preferable resist pattern can be obtained. Heating may be performed after irradiation with light or electron beams (post exposure baking: PEB) as necessary. The resist underlayer film is then removed by dry etching from portions in which the resist was removed through development in the above-described step, and thus a desired pattern can be formed on the substrate.

The exposure light to the photoresists is actinic rays such as near-ultraviolet rays, far-ultraviolet rays, and extreme-ultraviolet rays (e.g., EUV, wavelength of 13.5 nm). For example, light having a wavelength of 248 nm (KrF laser light), 193 nm (ArF laser light), or 157 nm ($F_2$ laser light) is used. The light irradiation method is not particularly limited as long as an acid can be generated from a photoacid generator and, for example, the exposure amount is 1 to 2,000 mJ/$cm^2$, 10 to 1,500 mJ/$cm^2$, or 50 to 1,000 mJ/$cm^2$.

Electron beam irradiation of the electron beam resist can be performed by using an electron beam irradiation device, for example.

In the present invention, a semiconductor device can be produced through: a step of forming a resist underlayer film, using the resist underlayer film-forming composition, on a semiconductor substrate; a step of forming a resist film thereon; a step of forming a resist pattern by irradiation with light or electron beams and development; a step of etching the resist underlayer film using the resist pattern; and a step of fabricating the semiconductor substrate using the resist underlayer film patterned.

When a finer resist pattern is further pursued, a problem of resolution and a problem in which the resist pattern collapses after development may occur, and thus thinner resists are required. This makes it difficult to achieve sufficient resist pattern film thickness for fabrication of a substrate, and thus a process has become necessary in which the function of a mask during the substrate fabrication is imparted not only to the resist pattern, but also to a resist underlayer film that is formed between the resist and a semiconductor substrate to be fabricated. As a resist underlayer film for such a process, unlike a conventional resist underlayer film having a high etching-rate property, a resist underlayer film for lithography having a selection ratio of dry etching rate that is close to that of a resist, a resist underlayer film for lithography having a selection ratio of dry etching rate that is smaller than that of the resist, or a resist underlayer film for lithography having a selection ratio of dry etching rate that is smaller than that of a semiconductor substrate is required. An anti-reflection property can be imparted to such a resist underlayer film, which enables the resist underlayer film to serve as a conventional anti-reflective coating.

To obtain fine resist patterns, a process has also begun to be used in which a resist pattern and a resist underlayer film upon dry etching of a resist underlayer film are set to be thinner than the pattern width at the time of resist development. As a resist underlayer film for such a process, unlike a conventional anti-reflective coating having a high etching-rate property, a resist underlayer film having a selection ratio of dry etching rate that is close to that of a resist is required. An anti-reflection property can be imparted to such a resist underlayer film, which enables the resist underlayer film to serve as a conventional anti-reflective coating.

In the present invention, after the resist underlayer film of the present invention is formed on a substrate, a resist can be applied directly onto the resist underlayer film or, as necessary, onto a film formed by applying one to several layers of coating film material onto the resist underlayer film. Accordingly, the substrate can be fabricated by selecting an appropriate etching gas even if the pattern width of the resist is narrow and the resist is thinly coated in order to prevent pattern collapse.

More specifically, a semiconductor device can be produced through: a step of forming the resist underlayer film on a semiconductor substrate using the resist underlayer film-forming composition; a step of forming thereon a hard mask using a coating film material that contains a silicon component, for example, or a hard mask (e.g., silicon oxynitride) by deposition; a step of further forming a resist film thereon; a step of forming a resist pattern by irradiation with light or electron beams and development; a step of etching the hard mask using the resist pattern with a halogen-based gas; a step of etching the resist underlayer film using the hard mask patterned with an oxygen-based gas or a hydrogen-based gas; and a step of fabricating the semiconductor substrate using the resist underlayer film patterned with a halogen-based gas.

When the effect of the resist underlayer film-forming composition for lithography of the present invention serving as an anti-reflective coating is considered, the light-absorbing portions are incorporated in the skeleton and thus no substances diffuse into the photoresist during drying by heating. The light-absorbing portions also have sufficiently high light-absorbing ability, and thus the resist underlayer film exhibits high anti-reflection effect.

The resist underlayer film-forming composition for lithography of the present invention exhibits high thermal stability, can prevent contamination of an upper layer film caused by decomposition products during baking, and can provide a sufficient temperature margin during the baking step.

Furthermore, the resist underlayer film material for lithography of the present invention can be used as a film that, depending on the process conditions, has a function of preventing reflection of light and also a function of preventing interactions between the substrate and the photoresist or preventing adverse effects on the substrate caused by materials that are used in the photoresist or by substances that are generated during exposure of the photoresist to light.

EXAMPLES

Synthesis Example 1

8.0 g of phenothiazine (manufactured by Tokyo Chemical Industry Co., Ltd.), 6.3 g of 1-naphthaldehyde, (manufactured by Tokyo Chemical Industry Co., Ltd.), 0.81 g of p-toluenesulfonic acid monohydrate (manufactured by Tokyo Chemical Industry Co., Ltd.), and 35.2 g of 1,4-dioxane (manufactured by Kanto Chemical Co., Inc.) were put in a 100-ml recovery flask. Thereafter, the interior of the flask was purged with nitrogen, and then the flask was heated with stirring under reflux for about 28 hours. After the reaction was completed, the solution was diluted with 10 g of 1,4-dioxane (manufactured by Kanto Chemical Co., Inc.). The diluted solution was dropped into a mixed solution of methanol/28% aqueous ammonia (500 g/5 g) for reprecipitation. The obtained precipitate was suction-filtered, and the residue was washed with methanol and then dried under reduced pressure for one night at 85° C., whereby 5.8 g of novolak resin was obtained. The obtained polymer corresponded to that of Formula (2-1). The weight-average molecular weight Mw measured in terms of polystyrene by GPC was 1,200.

Synthesis Example 2

12.0 g of phenothiazine (manufactured by Tokyo Chemical Industry Co., Ltd.), 6.4 g of benzaldehyde (manufactured by Tokyo Chemical Industry Co., Ltd.), 1.2 g of p-toluenesulfonic acid monohydrate (manufactured by Tokyo Chemical Industry Co., Ltd.), and 112.8 g of 1,4-dioxane (manufactured by Kanto Chemical Co., Inc.) were put in a 100-ml recovery flask. Thereafter, the interior of the flask was purged with nitrogen, and then the flask was heated with stirring under reflux for about 26 hours. After the reaction was completed, the solution was diluted with 22 g of tetrahydrofuran (manufactured by Kanto Chemical Co., Inc.). The diluted solution was dropped into 750 g of methanol for reprecipitation. The obtained precipitate was suction-filtered, and the residue was washed with methanol and then dried under reduced pressure for one night at 85° C., whereby 2.2 g of novolak resin was obtained. The obtained polymer corresponded to that of Formula (2-2). The weight-average molecular weight Mw measured in terms of polystyrene by GPC was 6,800.

Synthesis Example 3

10.0 g of phenothiazine (manufactured by Tokyo Chemical Industry Co., Ltd.), 9.1 g of 9-fluorenone (manufactured by Tokyo Chemical Industry Co., Ltd.), 1.0 g of p-toluenesulfonic acid monohydrate (manufactured by Tokyo Chemical Industry Co., Ltd.), and 46.8 g of toluene (manufactured by Kanto Chemical Co., Inc.) were put in a 100-ml recovery flask. Thereafter, the interior of the flask was purged with nitrogen, and then the flask was heated with stirring under reflux for about 29 hours. After the reaction was completed, the solution was diluted with 10.4 g of tetrahydrofuran (manufactured by Kanto Chemical Co., Inc.). The diluted solution was dropped into 800 ml of methanol for reprecipitation. The obtained precipitate was suction-filtered, and the residue was washed with methanol and then dried under reduced pressure for one night at 85° C., whereby 12.4 g of novolak resin was obtained. The obtained polymer corresponded to that of Formula (2-3). The weight-average molecular weight Mw measured in terms of polystyrene by GPC was 800.

Synthesis Example 4

5.22 g of phenoxazine (manufactured by Tokyo Chemical Industry Co., Ltd.), 4.45 g of 1-naphthaldehyde (manufactured by Tokyo Chemical Industry Co., Ltd.), 0.67 g of p-toluenesulfonic acid monohydrate (manufactured by Tokyo Chemical Industry Co., Ltd.), 11.93 g of toluene (manufactured by Kanto Chemical Co., Inc.), and 11.93 g of 1,4-dioxane (manufactured by Kanto Chemical Co., Inc.) were put in a 100-ml recovery flask. Thereafter, the interior of the flask was purged with nitrogen, and then the flask was heated with stirring under reflux for about 30 hours. After the reaction was completed, the solution was diluted with 10.0 g of 1,4-dioxane (manufactured by Kanto Chemical Co., Inc.). The diluted solution was dropped into 500 ml of methanol for reprecipitation. The obtained precipitate was suction-filtered, and the residue was washed with methanol and then dried under reduced pressure for one night at 85° C., whereby 4.4 g of novolak resin was obtained. The obtained polymer corresponded to that of Formula (2-9). The weight-average molecular weight Mw measured in terms of polystyrene by GPC was 2,500.

Synthesis Example 5

20.0 g of phenothiazine (manufactured by Tokyo Chemical Industry Co., Ltd.), 12.7 g of phloroglucinol (manufactured by Tokyo Chemical Industry Co., Ltd.), 33.5 g of 1-naphthaldehyde (manufactured by Tokyo Chemical Industry Co., Ltd.), 2.0 g of methanesulfonic acid (manufactured by Tokyo Chemical Industry Co., Ltd.), and 154.1 g of propylene glycol monomethyl ether were put in a 300-ml recovery flask. Thereafter, the mixture was stirred under reflux for about 8 hours. After the reaction was completed, the reaction solution was dropped into methanol for reprecipitation. The obtained precipitate was suction-filtered, and the residue was washed with methanol and then dried under reduced pressure for one night at 85° C., whereby 28.1 g of novolak resin was obtained. The obtained polymer corresponded to that of Formula (2-29). The weight-average molecular weight Mw measured in terms of polystyrene by GPC was 1,100.

Synthesis Example 6

7.0 g of phenothiazine (manufactured by Tokyo Chemical Industry Co., Ltd.), 5.6 g of 1,5-dihydroxynaphthalene (manufactured by Tokyo Chemical Industry Co., Ltd.), 10.2 g of 1-naphthaldehyde (manufactured by Tokyo Chemical Industry Co., Ltd.), 0.67 g of methanesulfonic acid (manufactured by Tokyo Chemical Industry Co., Ltd.), and 55.2 g of propylene glycol monomethyl ether were put in a 100-ml recovery flask. Thereafter, the mixture was stirred under reflux for about 3 hours. After the reaction was completed, the reaction solution was dropped into methanol for reprecipitation. The obtained precipitate was suction-filtered, and the residue was washed with methanol and then dried under reduced pressure for one night at 85° C., whereby 12.2 g of novolak resin was obtained. The obtained polymer corresponded to that of Formula (2-30). The weight-average molecular weight Mw measured in terms of polystyrene by GPC was 4,300.

Synthesis Example 7

15.0 g of phenothiazine (manufactured by Tokyo Chemical Industry Co., Ltd.), 9.97 g of dicyclopentadiene (manufactured by Tokyo Chemical Industry Co., Ltd.), 1.1 g of trifluoromethanesulfonic acid (manufactured by Tokyo Chemical Industry Co., Ltd.), and 46.4 g of butyl cellosolve were put in a 100-ml recovery flask. Thereafter, the mixture was stirred under reflux for about 8 hours. After the reaction was completed, the reaction solution was dropped into methanol for reprecipitation. The obtained precipitate was suction-filtered, and the residue was washed with methanol and then dried under reduced pressure for one night at 85° C., whereby 12.2 g of copolymer resin was obtained. The obtained polymer corresponded to that of Formula (2-31). The weight-average molecular weight Mw measured in terms of polystyrene by GPC was 2,500.

Synthesis Example 8

13.0 g of phenothiazine (manufactured by Tokyo Chemical Industry Co., Ltd.), 9.79 g of terephthalaldehydic acid (manufactured by Tokyo Chemical Industry Co., Ltd.), 1.31 g of para-toluenesulfonic acid monohydrate (manufactured by Tokyo Chemical Industry Co., Ltd.), and 56.2 g of dioxane were put in a 100-ml recovery flask. Thereafter, the mixture was stirred under reflux for about 8 hours. After the reaction was completed, the reaction solution was dropped into a mixed solution of methanol/water (400 ml/100 ml) for reprecipitation. The obtained precipitate was suction-filtered, and the residue was washed with methanol and then dried under reduced pressure for one night at 85° C., whereby 13.7 g of novolak resin was obtained. The obtained polymer corresponded to that of Formula (2-7). The weight-average molecular weight Mw measured in terms of polystyrene by GPC was 2,510.

Comparative Synthesis Example 1

8.0 g of carbazole (manufactured by Tokyo Chemical Industry Co., Ltd.), 28.0 g of 1-naphthaldehyde (manufactured by Tokyo Chemical Industry Co., Ltd.), 3.6 g of p-toluenesulfonic acid monohydrate (manufactured by Tokyo Chemical Industry Co., Ltd.), and 143.8 g of toluene (manufactured by Kanto Chemical Co., Inc.) were put in a 100-ml recovery flask. Thereafter, the interior of the flask was purged with nitrogen, and then the flask was heated with stirring under reflux for about 27 hours. After the reaction was completed, the solution was diluted with 90.5 g of tetrahydrofuran (manufactured by Kanto Chemical Co., Inc.). The diluted solution was dropped into 2,000 ml of methanol for reprecipitation. The obtained precipitate was suction-filtered, and the residue was washed with methanol and then dried under reduced pressure for one night at 85° C., whereby 37.9 g of novolak resin was obtained. The obtained polymer corresponded to that of Formula (7). The weight-average molecular weight Mw measured in terms of polystyrene by GPC was 3,800.

Formula (7)

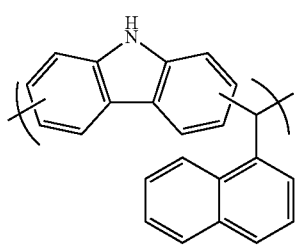

Example 1

2 g of the polymer obtained in Synthesis Example 1 was dissolved in 13.8 g of propylene glycol monomethyl ether acetate, 4.6 g of propylene glycol monomethyl ether, and 4.6 g of cyclohexanone, whereby a solution of a resist underlayer film-forming composition used in a lithography process with a multilayer film was prepared.

Example 2

2 g of the polymer obtained in Synthesis Example 2 was dissolved in 13.8 g of propylene glycol monomethyl ether acetate, 4.6 g of propylene glycol monomethyl ether, and 4.6 g of cyclohexanone, whereby a solution of a resist underlayer film-forming composition used in a lithography process with a multilayer film was prepared.

Example 3

2 g of the polymer obtained in Synthesis Example 3 was dissolved in 13.8 g of propylene glycol monomethyl ether acetate, 4.6 g of propylene glycol monomethyl ether, and 4.6 g of cyclohexanone, whereby a solution of a resist underlayer film-forming composition used in a lithography process with a multilayer film was prepared.

Example 4

2 g of the polymer obtained in Synthesis Example 4 was dissolved in 13.8 g of propylene glycol monomethyl ether acetate, 4.6 g of propylene glycol monomethyl ether, and 4.6 g of cyclohexanone, whereby a solution of a resist underlayer film-forming composition used in a lithography process with a multilayer film was prepared.

Example 5

2.5 g of the polymer obtained in Synthesis Example 1, 0.375 g of methylol compound (Formula (8) below, trade name: CYMEL 303, manufactured by CYTEC Industries Inc.) as a cross-linking agent, and 0.038 g of pyridinium p-toluenesulfonate as a catalyst were dissolved in 20.1 g of propylene glycol monomethyl ether acetate, 6.70 g of propylene glycol monomethyl ether, and 6.70 g of cyclohexanone, whereby a solution of a resist underlayer film-forming composition used in a lithography process with a multilayer film was prepared.

Formula (8)

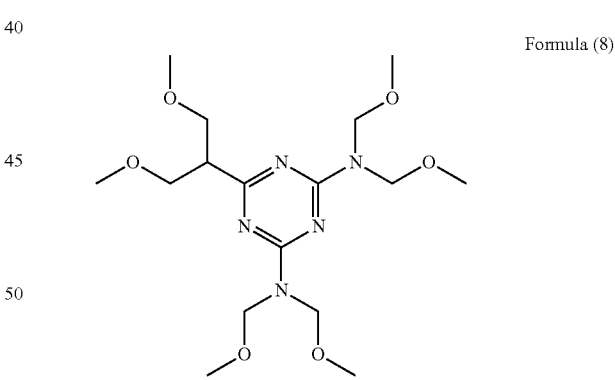

Example 6

2 g of the polymer obtained in Synthesis Example 5 was dissolved in 6.9 g of propylene glycol monomethyl ether acetate and 16.1 g of cyclohexanone, whereby a solution of a resist underlayer film-forming composition used in a lithography process with a multilayer film was prepared.

Example 7

2 g of the polymer obtained in Synthesis Example 6 was dissolved in 13.8 g of propylene glycol monomethyl ether acetate and 9.2 g of propylene glycol monomethyl ether, whereby a solution of a resist underlayer film-forming composition used in a lithography process with a multilayer film was prepared.

Example 8

2 g of the polymer obtained in Synthesis Example 7 was dissolved in 4.6 g of propylene glycol monomethyl ether acetate and 18.4 g of cyclohexanone, whereby a solution of a resist underlayer film-forming composition used in a lithography process with a multilayer film was prepared.

Example 9

2 g of the polymer obtained in Synthesis Example 8 was dissolved in 16.1 g of propylene glycol monomethyl ether acetate and 6.9 g of propylene glycol monomethyl ether, whereby a solution of a resist underlayer film-forming composition used in a lithography process with a multilayer film was prepared.

Comparative Example 1

A solution of a cresol novolak resin (commercially available product, weight-average molecular weight; 4,000) was used.

Comparative Example 2

2 g of the polymer obtained in Comparative Synthesis Example 1 was dissolved in 13.8 g of propylene glycol monomethyl ether acetate, and 4.6 g of propylene glycol monomethyl ether, and 4.6 g of cyclohexanone, whereby a solution of a resist underlayer film-forming composition used in a lithography process with a multilayer film was prepared.

(Measurement of Optical Parameters)

Each of the solutions of the resist underlayer film-forming compositions prepared in Examples 1 to 9 and Comparative Examples 1 to 2 was applied onto a silicon wafer by a spin coater. Each of them was baked on a hot plate at 240° C. for 1 minute or at 400° C. for 2 minutes (at 240° C. for 1 minute in Comparative Example 1) to form a resist underlayer film (film thickness: 0.05 µm). The refractive index (n value) at a wavelength of 193 nm and the optical absorption coefficient (k value, also called attenuation coefficient) of each resist underlayer film were measured with a spectroscopic ellipsometer. The results are given in Table 1.

TABLE 1

| Refractive index n and optical absorption coefficient k | | | |
|---|---|---|---|
| | | n (193 nm) | k (193 nm) |
| Example 1 | 240° C. baked film | 1.45 | 0.53 |
| Example 1 | 400° C. baked film | 1.46 | 0.50 |
| Example 2 | 240° C. baked film | 1.57 | 0.73 |
| Example 2 | 400° C. baked film | 1.55 | 0.62 |
| Example 3 | 240° C. baked film | 1.50 | 0.58 |
| Example 3 | 400° C. baked film | 1.46 | 0.56 |
| Example 4 | 240° C. baked film | 1.37 | 0.51 |
| Example 4 | 400° C. baked film | 1.43 | 0.50 |
| Example 5 | 240° C. baked film | 1.44 | 0.52 |
| Example 6 | 400° C. baked film | 1.38 | 0.47 |
| Example 7 | 400° C. baked film | 1.38 | 0.45 |
| Example 8 | 400° C. baked film | 1.46 | 0.44 |
| Example 9 | 400° C. baked film | 1.50 | 0.55 |
| Comparative Example 1 | 240° C. baked film | 1.53 | 0.42 |
| Comparative Example 1 | 400° C. baked film | Unmeasurable | Unmeasurable |

TABLE 1-continued

| Refractive index n and optical absorption coefficient k | | | |
|---|---|---|---|
| | | n (193 nm) | k (193 nm) |
| Comparative Example 2 | 240° C. baked film | 1.36 | 0.39 |
| Comparative Example 2 | 400° C. baked film | 1.37 | 0.44 |

(Dissolution Test in Photoresist Solvent)

Each of the solutions of the resist underlayer film-forming compositions prepared in Examples 1 to 9 and Comparative Examples 1 to 2 was applied onto a silicon wafer by a spin coater. Each of them was baked on a hot plate at 240° C. for 1 minute or at 400° C. for 2 minutes to form a resist underlayer film (film thickness: 0.20 µm). Each resist underlayer film was subjected to an immersion test in solvents used for the resist, for example, ethyl lactate, propylene glycol monomethyl ether, propylene glycol monomethyl ether acetate, and cyclohexanone.

The films resulting from baking the solutions of the resist underlayer film-forming compositions of Example 1 to Example 4, Example 6 to Example 9, and Comparative Example 2 at 240° C. for 1 minute dissolved in the solvents. It was found that the films resulting from baking the solutions of the resist underlayer film-forming compositions of Example 1 to Example 9 and Comparative Example 2 at 400° C. for 2 minutes were insoluble in the solvents. It was found that the films resulting from baking the solutions of the resist underlayer film-forming compositions of Example 5 and Comparative Example 1 at 240° C. for 1 minute were insoluble in the solvents.

(Measurement of Dry Etching Rate)

An etcher and etching gas below were used for measuring the dry etching rate. RIE-10NR (manufactured by SAMCO Inc.): $CF_4$ Each of the solutions of the resist underlayer film-forming compositions prepared in Examples 1 to 9 and Comparative Example 2 was applied onto a silicon wafer by a spin coater. Each of them was baked on a hot plate at 240° C. for 1 minute or at 400° C. for 2 minutes to form a resist underlayer film (film thickness: 0.20 µm). The dry etching rate was measured by using $CF_4$ gas as an etching gas.

The solution of Comparative Example 1 was applied onto a silicon wafer by a spin coater, and was baked on a hot plate at 240° C. for 1 minute to form a resist underlayer film (film thickness: 0.20 µm). The dry etching rate was measured by using $CF_4$ gas as an etching gas, and the dry etching rate was compared with those of the resist underlayer films of Examples 1 to 9 and Comparative Example 2. The results are given in Table 2. The rate ratio is the dry etching rate ratio of (the dry etching rate of a film formed by baking each of the resist underlayer films of Examples 1 to 9 and Comparative Example 2 at each temperature)/(the dry etching rate of a film formed by baking the resist underlayer film of Comparative Example 1 at 240° C.).

TABLE 2

| Dry etching rate ratio | | |
|---|---|---|
| Example 1 | Rate ratio for 240° C. baked film | 0.73 |
| Example 1 | Rate ratio for 400° C. baked film | 0.79 |
| Example 2 | Rate ratio for 240° C. baked film | 0.75 |
| Example 2 | Rate ratio for 400° C. baked film | 0.90 |
| Example 3 | Rate ratio for 240° C. baked film | 0.84 |

TABLE 2-continued

| | Dry etching rate ratio | |
|---|---|---|
| Example 3 | Rate ratio for 400° C. baked film | 0.89 |
| Example 4 | Rate ratio for 240° C. baked film | 0.78 |
| Example 4 | Rate ratio for 400° C. baked film | 0.81 |
| Example 5 | Rate ratio for 240° C. baked film | 0.82 |
| Example 6 | Rate ratio for 400° C. baked film | 0.99 |
| Example 7 | Rate ratio for 400° C. baked film | 0.89 |
| Example 8 | Rate ratio for 400° C. baked film | 1.05 |
| Example 9 | Rate ratio for 400° C. baked film | 1.02 |
| Comparative Example 2 | Rate ratio for 240° C. baked film | 0.73 |
| Comparative Example 2 | Rate ratio for 400° C. baked film | 0.81 |

(Measurement of Pattern Bending Resistance)

Each of the solutions of the resist underlayer film-forming compositions prepared in Examples 1 to 3, Examples 6 to 8, and Comparative Example 2 was applied by a spin coater onto a silicon wafer coated with a silicon oxide film. Each of them was baked on a hot plate at 400° C. for 2 minutes to form a resist underlayer film (film thickness: 200 nm). Onto the resist underlayer film, a solution of a silicon hard mask-forming composition was applied, and was baked at 240° C. for 1 minute to form a silicon hard mask layer (film thickness: 45 nm). Onto the silicon hard mask layer, a resist solution was applied, and was baked at 100° C. for 1 minute to form a resist layer (film thickness: 120 nm). The resist layer was exposed to light having a wavelength of 193 nm with a mask, and was subjected to post exposure bake PEB (at 105° C. for 1 minute), and then development is performed to obtain a resist pattern. Thereafter, dry etching was performed with a fluorine-based gas (the component was $CF_4$) to transfer the resist pattern onto the hard mask. Then, dry etching was performed with an oxygen-based gas (the components were $O_2/CO_2$) to transfer the resist pattern onto the resist underlayer film. Subsequently, dry etching was performed with a fluorine-based gas (the components were $C_4F_8/O_2/Ar$) to remove the silicon oxide film on the silicon wafer. The shape of each pattern at that time was observed with an electron microscope.

As the pattern width becomes smaller, irregular bending of the pattern called "wiggling" is more likely to occur. The above-described steps were performed with the resist underlayer film-forming compositions of the above Examples, and the pattern width when such pattern bending (wiggling) started to occur was observed with an electron microscope. Because occurrence of pattern bending (wiggling) makes it impossible to fabricate a substrate on the basis of a faithful pattern, it is necessary to fabricate the substrate on the basis of the pattern width immediately before the pattern bending (wiggling) starts to occur. A smaller pattern width when pattern bending (wiggling) starts to occur enables finer fabrication of the substrate. To measure resolution, a critical dimension scanning electron microscope (manufactured by Hitachi, Ltd.) was used. The measurement results are given in Table 3.

TABLE 3

| Pattern width when pattern bending (wiggling) starts to occur | |
|---|---|
| (When using resist underlayer film-forming composition of Example 1) | 30.1 nm |
| (When using resist underlayer film-forming composition of Example 2) | 32.7 nm |
| (When using resist underlayer film-forming composition of Example 3) | 31.7 nm |
| (When using resist underlayer film-forming composition of Example 6) | 31.7 nm |
| (When using resist underlayer film-forming composition of Example 7) | 30.2 nm |
| (When using resist underlayer film-forming composition of Example 8) | 32.7 nm |
| (When using resist underlayer film-forming composition of Comparative Example 2) | 34.0 nm |

(Embeddability Test)

Each of the solutions of the underlayer film-forming compositions for lithography of the present invention obtained in Examples 1 to 2 and Comparative Example 2 was applied by a spin coater onto a wafer substrate with $SiO_2$ having holes (diameter: 0.13 μm, depth: 0.7 μm). The pattern herein is a pattern in which the distance between the center of a hole and the center of a neighboring hole is one time as large as the diameter of the holes.

After the application by a spin coater, each solution was baked on a hot plate at 400° C. for 2 minutes to form an underlayer film. With a scanning electron microscope (SEM), the cross-section shape of the wafer substrate with $SiO_2$ having holes onto which the underlayer film-forming composition for lithography of the present invention obtained in Example 1 was applied was observed to evaluate the embeddability of the underlayer film on the basis of the following criteria. The result was defined as excellent (represented by "○" in Table 4) when the underlayer film was able to be embedded in the holes with no void, and the result was defined as defective (represented by "×" in Table 4) when the underlayer film formed voids in the holes.

TABLE 4

| | Embeddability test | |
|---|---|---|
| Example 1 | 400° C. baked film | ○ |
| Example 2 | 400° C. baked film | ○ |
| Comparative Example 2 | 400° C. baked film | × |

INDUSTRIAL APPLICABILITY

Thus, the resist underlayer film material of the present invention used in a lithography process with a multilayer film can provide a resist underlayer film that has a selection ratio of dry etching rate close to that of a photoresist or smaller than that of the photoresist, or a selection ratio of dry etching rate smaller than that of a semiconductor substrate, unlike conventional high etch rate anti-reflective coatings, and that also has the effect of an anti-reflective coating.

It was found that the film functions as a hard mask, on the basis of a comparison of the dry etching rate ratio of the film formed by baking at 400° C. with that of a phenol novolak resin in a conventional product. Accordingly, the film exhibits heat resistance to a temperature of 400° C. or above.

It was found that the underlayer film material of the present invention has such heat resistance as to enable formation of a hard mask on the top layer through deposition.

The invention claimed is:

1. A resist underlayer film-forming composition comprising:

a polymer comprising a unit structure of Formula (1):

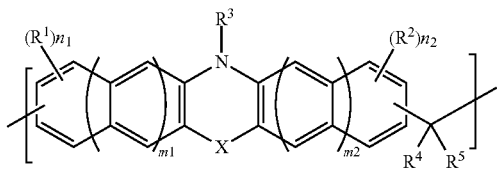

Formula (1)

wherein in Formula (1), $R^1$ and $R^2$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or a group in which any of these are combined;

$R^3$ is a hydrogen atom, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or a group in which any of these are combined;

$R^4$ is a $C_{6-40}$ aryl group or a heterocyclic group, and the aryl group and the heterocyclic group each are optionally substituted with a halogen group, a nitro group, an amino group, a $C_{1-10}$ alkyl group, a $C_{1-10}$ alkoxy group, a $C_{6-40}$ aryl group, a formyl group, a carboxy group, a carboxylic acid ester group, or a hydroxy group;

$R^5$ is a hydrogen atom, a $C_{1-10}$ alkyl group, a $C_{6-40}$ aryl group, or a heterocyclic group, and the alkyl group, the aryl group, and the heterocyclic group each are optionally substituted with a halogen group, a nitro group, an amino group, or a hydroxy group, and $R^4$ and $R^5$ optionally form a ring together with a carbon atom bonded to $R^4$ and $R^5$;

X is an O atom, a S atom, a $CH_2$ group, a C=O group, a CH=CH group, or a $CH_2$—$CH_2$ group;

$n_1$ and $n_2$ each are an integer ranging from 0 to 3; and m1 and m2 each are an integer ranging from 0 to 3, and the polymer is contained in the composition at a proportion of 50 to 100% by mass of a solid content of the composition, the solid content being the content of all components of the resist underlayer film-forming composition excluding a solvent.

2. The resist underlayer film-forming composition according to claim 1, wherein $R^3$ is a hydrogen atom in Formula (1).

3. The resist underlayer film-forming composition according to claim 1, wherein both $n_1$ and $n_2$ are 0 in Formula (1).

4. The resist underlayer film-forming composition according to claim 1, wherein the polymer is a polymer comprising the unit structure of Formula (1) and a unit structure of Formula (3):

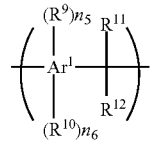

Formula (3)

wherein in Formula (3), $Ar^1$ is a $C_{6-20}$ aromatic ring group; $R^9$ and $R^{10}$ each are a substituent of a hydrogen atom on an aromatic ring, $R^9$ is a hydroxy group, and $R^{10}$ is a halogen group, a nitro group, an amino group, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or an organic group in which any of these are combined;

$R^{11}$ is a hydrogen atom, a $C_{6-40}$ aryl group or a heterocyclic group that is optionally substituted with a halogen group, a nitro group, an amino group, a formyl group, a carboxy group, or a hydroxy group;

$R^{12}$ is a hydrogen atom, a $C_{1-10}$ alkyl group, a $C_{6-40}$ aryl group, or a heterocyclic group that is optionally substituted with a halogen group, a nitro group, an amino group, a formyl group, a carboxy group, or a hydroxy group, and $R^{11}$ and $R^{12}$ optionally form a ring together with a carbon atom bonded to $R^{11}$ and $R^{12}$;

$n_5$ is an integer ranging from one to a maximum number of substituents that are capable of being substituted on an $Ar^1$ ring and $n_6$ is an integer ranging from the ((maximum number of substituents that are capable of being substituted on the $Ar^1$ ring)–$n_5$) to zero.

5. The resist underlayer film-forming composition according to claim 1, further comprising:

a cross-linking agent.

6. The resist underlayer film-forming composition according to claim 1, further comprising:

an acid and/or an acid generator.

7. A resist underlayer film-forming composition comprising:

a polymer comprising a unit structure of Formula (2):

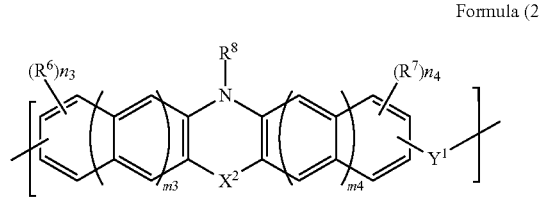

Formula (2)

wherein in Formula (2), $R^6$ and $R^7$ each are a substituent of a hydrogen atom on an aromatic ring, and are each independently a halogen group, a nitro group, an amino group, a carboxylic acid group, a hydroxy group, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or a group in which any of these are combined;

$R^8$ is a hydrogen atom, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or a group in which any of these are combined;

$X^2$ is an O atom, a S atom, a $CH_2$ group, a C=O group, a CH=CH group, or a $CH_2$—$CH_2$ group;

$Y^1$ is a divalent group derived from a cycloolefin ring compound;

$n_3$ and $n_4$ each are an integer ranging from 0 to 3; and m3 and m4 each are an integer ranging from 0 to 3.3.

8. The resist underlayer film-forming composition according to claim 7, wherein $R^8$ is a hydrogen atom in Formula (2).

9. The resist underlayer film-forming composition according to claim 7, wherein both $n_3$ and $n_4$ are 0 in Formula (2).

10. The resist underlayer film-forming composition according to claim 7, wherein the polymer is a polymer comprising the unit structure of Formula (2) and a unit structure of Formula (4):

Formula (4)

wherein in Formula (4), $Ar^2$ is a $C_{6-20}$ aromatic ring group; $R^{13}$ and $R^{14}$ each are a substituent of a hydrogen atom on an aromatic ring, $R^{13}$ is a hydroxy group, and $R^{14}$ is a halogen group, a nitro group, an amino group, a $C_{1-10}$ alkyl group, a $C_{2-10}$ alkenyl group, a $C_{6-40}$ aryl group, an organic group comprising an ether bond, an organic group comprising a ketone bond, an organic group comprising an ester bond, or an organic group in which any of these are combined;

$Y^2$ is a divalent group derived from a cycloolefin ring compound;

$n_7$ is an integer ranging from one to a maximum number of substituents that are capable of being substituted on an $Ar^2$ ring; and $n_8$ is an integer ranging from ((the maximum number of substituents that are capable of being substituted on the $Ar^2$ ring)-$n_7$) to zero.

11. A resist underlayer film obtained by applying the resist underlayer film-forming composition as claimed in claim 1 onto a semiconductor substrate and baking the resist underlayer film-forming composition.

12. A method for forming a resist pattern used in production of a semiconductor, the method comprising:

applying the resist underlayer film-forming composition as claimed in claim 1 onto a semiconductor substrate and baking the resist underlayer film-forming composition to form an underlayer film.

13. A method for producing a semiconductor device, the method comprising:

forming an underlayer film on a semiconductor substrate using the resist underlayer film-forming composition as claimed in claim 1;

forming a resist film on the underlayer film;

forming a resist pattern by irradiation with light or electron beams and development;

etching the underlayer film using the resist pattern; and fabricating the semiconductor substrate using the patterned underlayer film.

14. A method for producing a semiconductor device, the method comprising:

forming an underlayer film on a semiconductor substrate using the resist underlayer film-forming composition as claimed in claim 1;

forming a hard mask on the underlayer film;

further forming a resist film on the hard mask;

forming a resist pattern by irradiation with light or electron beams and development;

etching the hard mask using the resist pattern;

etching the underlayer film using the hard mask patterned; and fabricating the semiconductor substrate using the patterned underlayer film.

15. The method for producing a semiconductor device according to claim 14, wherein the hard mask is formed by deposition of an inorganic substance.

* * * * *